United States Patent [19]
Nishimaki et al.

[11] Patent Number: 5,474,224
[45] Date of Patent: * Dec. 12, 1995

[54] WIRE BONDER AND WIRE BONDING METHOD

[75] Inventors: Kimiji Nishimaki; Takashi Kamiharako, both of Tokyo, Japan

[73] Assignee: Kaijo Corporation, Tokyo, Japan

[*] Notice: The portion of the term of this patent subsequent to Oct. 10, 2012, has been disclaimed.

[21] Appl. No.: 219,450

[22] Filed: Mar. 29, 1994

[30] Foreign Application Priority Data

Jul. 16, 1993 [JP] Japan .................. 5-199236

[51] Int. Cl.⁶ .................................................. H01L 21/60
[52] U.S. Cl. ...................... 228/102; 228/9; 228/180.5
[58] Field of Search .................. 228/4.5, 9, 102, 228/104, 180.5, 105

[56] References Cited

U.S. PATENT DOCUMENTS 5,145,099 9/1992 Wood et al. .................. 228/9
5,356,065 10/1994 Kobayashi .................. 228/9 X

FOREIGN PATENT DOCUMENTS 167340 8/1985 Japan .................. 228/105
78239 3/1990 Japan .................. 228/102

Primary Examiner—Kenneth J. Ramsey
Attorney, Agent, or Firm—Sughrue, Mion, Zinn, Macpeak & Seas

[57] ABSTRACT

The present invention provides an apparatus and its method that is able to effectively use positional data such as coordinates and so forth stored in advance in a bonder.

A first or second bonding point in the form of bonded sites is photographed by a camera based on commands from a control device, and inspection is performed as to whether a bonded indentation is present within a specified range at a location specified in advance and/or centering on said location.

39 Claims, 18 Drawing Sheets

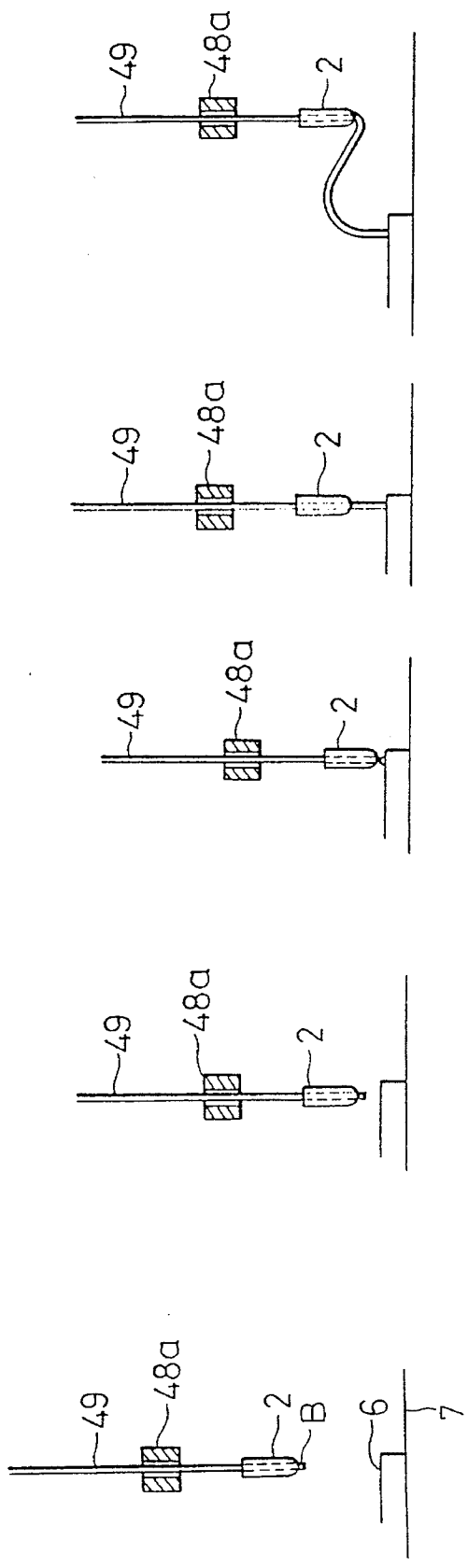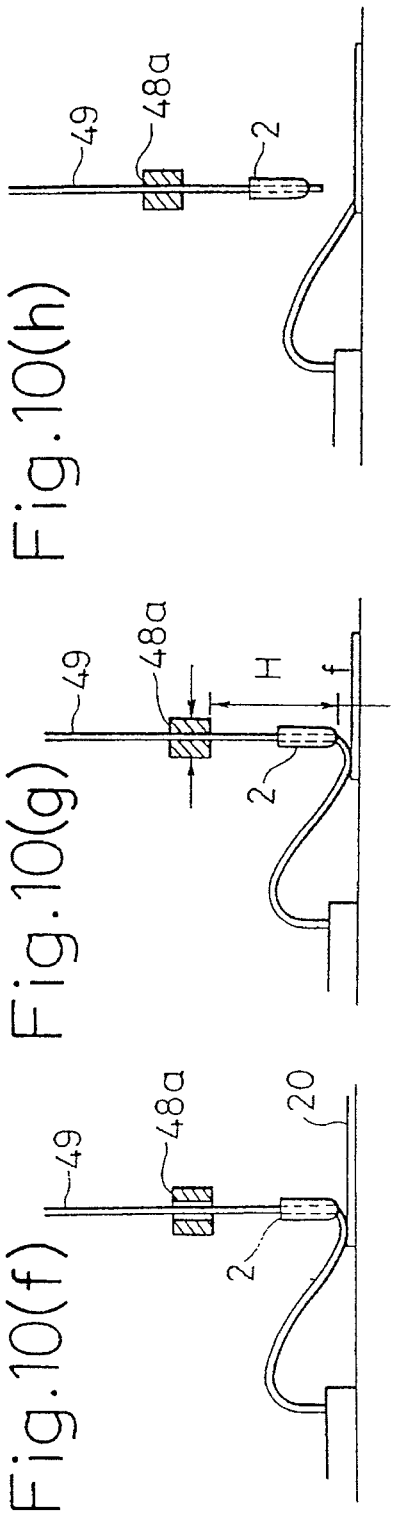

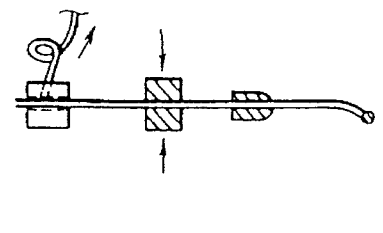
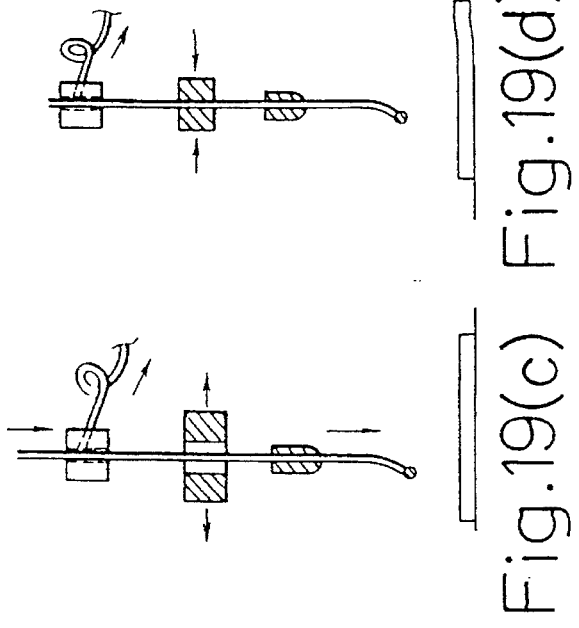
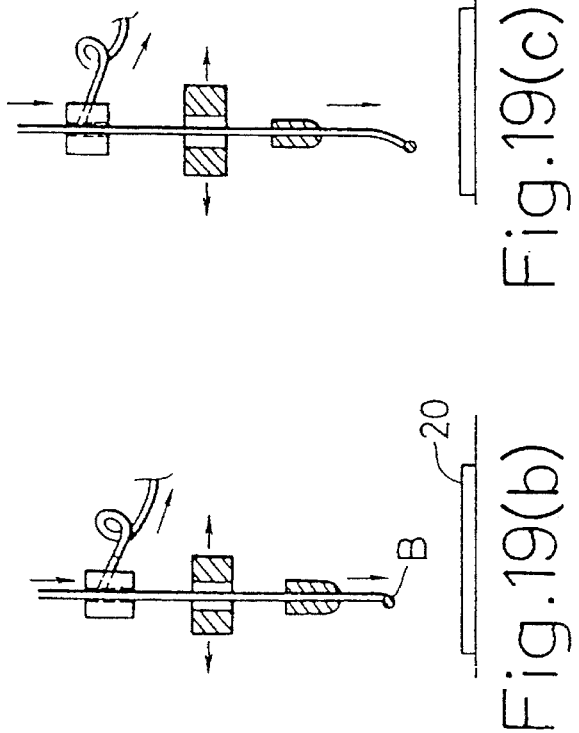
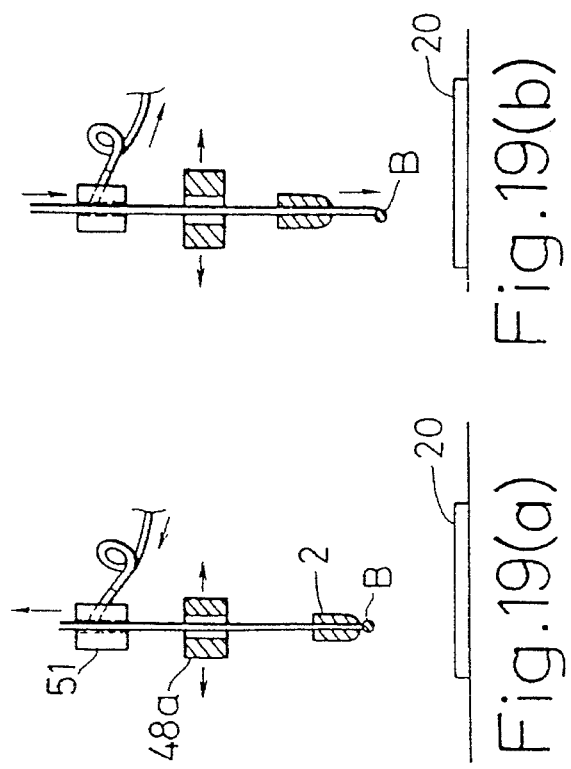
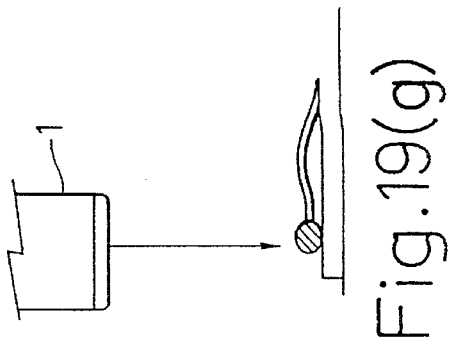
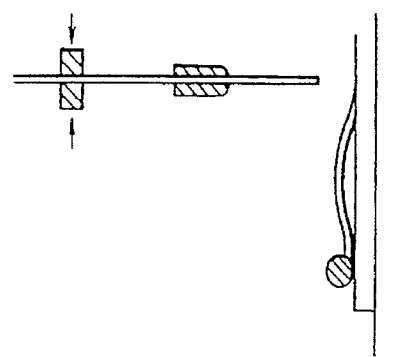
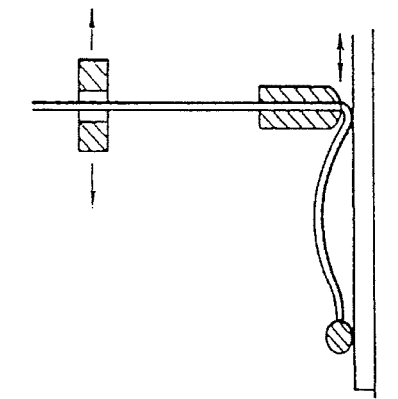

WIRE BONDER AND WIRE BONDING METHOD

BACKGROUND OF THE INVENTION

1. Field of the Invention

The present invention relates to a wire bonder, and more particularly, to a wire bonder and that wire bonding method equipped with an automatic inspection function for an electrode (pad) on a semiconductor chip (IC chip), lead and wire spread between said pad and lead in the assembly process of a semiconductor device.

2. Description of the Prior Art

In the assembly process during manufacturing of semiconductor integrated circuits (IC) and large-scale integrated circuits (LSI), a first bonding point in the form of an electrode (pad) on a semiconductor chip (IC chip) and a second bonding point in the form of a lead are connected by bonding using gold wire or wire made of copper or aluminum.

This bonder first produces an electrical discharge by applying a high voltage between the end of a protruding wire and a discharge electrode (electric torch) from a bonding tool in the form of a capillary. The end of the wire is then melted by the energy of that discharge resulting in the formation of ball on the end of the wire that has been inserted into the capillary. By then applying ultrasonic vibrations while bringing the ball held on the end of the capillary in contact with an electrode (pad) on a semiconductor chip, the wire is connected to the bonding point.

In order to confirm whether a wire that has been automatically bonded by a bonder has been reliably connected to the pad or lead, or confirm whether the connected wire has formed a loop on the wire connecting the pad and lead in the prior art, the bonded lead frame is continuously or at fixed intervals removed from the assembly process followed by the performing of an inspection for non-defective or defective products by an inspector using a microscope and so forth in a separate inspection process. In this inspection process, an inspection is performed as to whether the wire has been reliably bonded, and namely, a misattachment inspection is also performed to determine if the wire has been broken, there are defective connections and so forth by performing a visual inspection and so on.

Moreover, an inspection is also performed using a microscope and so forth as to whether the initial ball formed on the end of the wire has been formed to the proper size as set with, for example, a keyboard. Adjustments of each section are then performed based on these inspection results.

However, in order to perform the above-mentioned inspections using a bonder of the prior art, since the bonded lead frame is removed from the assembly line and inspected in a separate inspection process, even in the case a problem such as a connection defect occurred in this inspection process, said data cannot immediately be fed back to the bonder. Consequently, this bonder has the disadvantage of producing a large number of defective products. In addition, even if this inspection data was fed back, since there is variation as to what data should be fed back depending on the inspector, this bonder also has the disadvantage of there being the risk of reliable data not being consistently fed back. Moreover, although adjustment of the bonder is required following the discovery of a defect, a considerable amount of time is required to determine what section should be adjusted even for a skilled technician. Since a considerable amount of time is required to perform this task, this impairs the stability and reliability of the bonder. Moreover, the additional disadvantage results in which the-bonder, which is used for the purpose of high-speed operation, must be stopped for a long period of time in order to make adjustments during that time.

In addition, in the bonder of the prior art, since separate inspection processes are required like those described above, the bonder of the prior art also has the disadvantage of the inspection equipment being expensive and requiring a large amount of space. In addition, it also has the disadvantage of requiring additional inspectors for performing the inspections in this inspection process.

SUMMARY OF THE INVENTION

Therefore, the present invention was completed in consideration of the above-mentioned problems of the prior art, and its object is to provide a wire bonder and wire bonding method that is able to directly and effectively utilize positional information of coordinates and so forth that has been pre-stored in memory in a wire bonder. In addition, a second object of the present invention is to provide a wire bonder and wire bonding method that is able to automatically perform bonding inspections on the bonder without using a separate inspection apparatus, and effectively utilize data by immediately feeding back said data from said inspections to the bonder even in the case of the occurrence of problems such as connection defects and so forth. In addition, a third object of the present invention is to provide a wire bonder and wire bonding method wherein the adjustment locations of the bonder can be easily determined by anyone to improve the stability and reliability of the bonder while also conserving on space and being inexpensively priced.

The present invention is equipped with a recognition device, a control device that performs various controls based on the evaluation from said recognition device, and a drive device that drives each mechanism based on commands from said control device, wherein, a first or second bonding point in the form of bonded sites is photographed by a photographic device based on commands from said control device, and inspection is performed as to whether a bonded indentation is present within a specified range at a location specified in advance and/or centering on said location.

The present invention is equipped with a recognition device, a control device that performs various controls based on the evaluation from said recognition device, and a drive device that drives each mechanism based on commands from said control device, wherein, a first or second bonding point in the form of bonded sites is photographed by a photographic device based on commands from said control device, inspection is performed as to whether a bonded indentation is present within a specified range at a location specified in advance and/or centering on said location, and notification is performed by a notification device and/or said apparatus is stopped in the case a bonded indentation is evaluated as not being present at a predetermined location.

The present invention relates to a wire bonding method wherein a first or second bonding point in the form of bonded sites is photographed by a photographic device based on commands from a control device, and inspection is performed as to whether a bonded indentation is present within a specified range at a location specified in advance and/or centering on said location.

In addition, the present invention relates to a wire bonding method wherein a first or second bonding point in the form of bonded sites is photographed by a photographic device based on commands from a control device, inspection is performed as to whether a bonded indentation is present within a specified range at a location specified in advance and/or centering on said location, and notification is performed by a notification device and/or said apparatus is stopped in the case a bonded indentation is evaluated as not being present at a predetermined location.

The present invention is equipped with a recognition device, a control device that performs various controls based on the evaluation from said recognition device, and a drive device that drives each mechanism based on commands from said control device, wherein, a first or second bonding point in the form of bonded sites is photographed by a photographic device based on commands from a control device, inspection is performed as to whether a bonded indentation is present within a specified range at a location specified in advance and/or centering on said location, and inspection of indentation and/or stitch size is performed.

The present invention relates to a wire bonding method wherein a first or second bonding point in the form of bonded sites is photographed by a photographic device based on commands from a control device, inspection is performed as to whether a bonded indentation is present within a specified range at a location specified in advance and/or centering on said location, and inspection of indentation and/or stitch size is performed.

The present invention is equipped with a recognition device, a control device that performs various controls based on the evaluation from said recognition device, and a drive device that drives each mechanism based on commands from said control device, wherein, a first or second bonding point in the form of bonded sites is photographed by a photographic device based on commands from a control device, inspection is performed as to whether a bonded indentation is present within a specified range at a location specified in advance and/or centering on said location, and stitch location is detected from a specified location by said control device when an indentation is evaluated as being present.

The present invention relates to a wire bonding method wherein a first or second bonding point in the form of bonded sites is photographed by a photographic device based on commands from a control device, inspection is performed as to whether a bonded indentation is present within a specified range at a location specified in advance and/or centering on said location, and stitch location is detected from a specified location by said control device when an indentation is evaluated as being present.

The present invention is equipped with a recognition device, a control device that performs various controls based on the evaluation from said recognition device, and a drive device that drives each mechanism based on commands from said control device, wherein, a first or second bonding point in the form of bonded sites is photographed by said control photographic device based on commands from said control device, inspection is performed as to whether a bonded indentation is present within a specified range at a location specified in advance and/or centering on said location, the amount of deviation to the location of an indentation from a specified location is detected by said control device when an indentation is evaluated as being present, said data is accumulated and statistical processing is performed when said amount of deviation is within a predetermined deviation range, and camera tool distance or individual bonding reference coordinates are corrected and updated so that said indentation location agrees with a location specified in advance.

The present invention relates to a wire bonding method wherein a first or second bonding point in the form of bonded sites is photographed by a photographic device based on commands from a control device, inspection is performed as to whether a bonded indentation is present within a specified range at a location specified in advance and/or centering on said location, the amount of deviation to the location of an indentation from a specified location is detected by said control device when an indentation is evaluated as being present, said data is accumulated and statistical processing is performed when said amount of deviation is within a predetermined deviation range, and camera tool distance or individual bonding reference coordinates are corrected and updated so that said indentation location agrees with a location specified in advance.

The present invention is equipped with a recognition device, a control device that performs various controls based on the evaluation from said recognition device, and a drive device that drives each mechanism based on commands from said control device, wherein, a first or second bonding point in the form of bonded sites is photographed by a photographic device based on commands from a control device, inspection is performed as to whether a bonded wire is present within a specified range at a location specified in advance and/or centering on said location, and detection of misattachment is performed.

The present invention is equipped with a recognition device, a control device that performs various controls based on the evaluation from said recognition device, and a drive device that drives each mechanism based on commands from said control device, wherein, a first or second bonding point in the form of bonded sites is photographed by a photographic device based on commands from said control device, inspection is performed as to whether a bonded wire is present within a specified range at a location specified in advance and/or centering on said location, detection of misattachment is performed, and notification is performed by a notification device and/or said apparatus is stopped in the case a bonded wire is evaluated as not being present at a predetermined location.

The present invention relates to a wire bonding method wherein a first or second bonding point in the form of bonded sites is photographed by a photographic device based on commands from a control device, inspection is performed as to whether a bonded wire is present within a specified range at a location specified in advance and/or centering on said location, and detection of misattachment is performed.

In addition, the present invention relates to a wire bonding method wherein a first or second bonding point in the form of bonded sites is photographed by a photographic device based on commands from said control device, inspection is performed as to whether a bonded wire is present within a specified range at a location specified in advance and/or centering on said location, detection of misattachment is performed, and notification is performed by a notification device and/or said apparatus is stopped in the case a bonded wire is evaluated as not being present at a predetermined location.

In addition, the present invention relates to a wire bonding method wherein a first or second bonding point in the form of bonded sites is photographed by a photographic device based on commands from a control device, inspection is performed as to whether a bonded wire is present within a specified range at a location specified in advance and/or centering on said location, and the amount of wire curvature is determined by determining the distance from a location specified in advance between a first bonding point and second bonding point to a wire when a wire is evaluated as being present according to said inspection.

Moreover, the present invention relates to a wire bonding method wherein a first or second bonding point in the form of bonded sites is photographed by a photographic device based on commands from said control device, inspection is performed as to whether a bonded wire is present within a specified range at a location specified in advance and/or centering on said location, the amount of wire curvature is determined by determining the distance from a location specified in advance between a first bonding point and second bonding point to a wire when a wire is evaluated as being present according to said inspection, notification is performed by a notification device and/or said apparatus is stopped when said amount of curvature is outside a predetermined range, said data is accumulated and statistical processing is performed when said amount of curvature is within a predetermined range, and individual bonding parameters are corrected and updated so that said amount of curvature agrees with a location specified in advance.

BRIEF DESCRIPTION OF THE DRAWINGS

FIGS. 10(a)–10(h) are views showing the process by which bonding is performed using the wire bonder as claimed in the present invention.

FIGS. 19(a)–19(g) are views showing the process by which an initial ball is measured using the wire bonder as claimed in the present invention.

DESCRIPTION OF THE PREFERRED EMBODIMENTS

The following provides an explanation of the preferred embodiments of the present invention with reference to the drawings.

Figure 1:
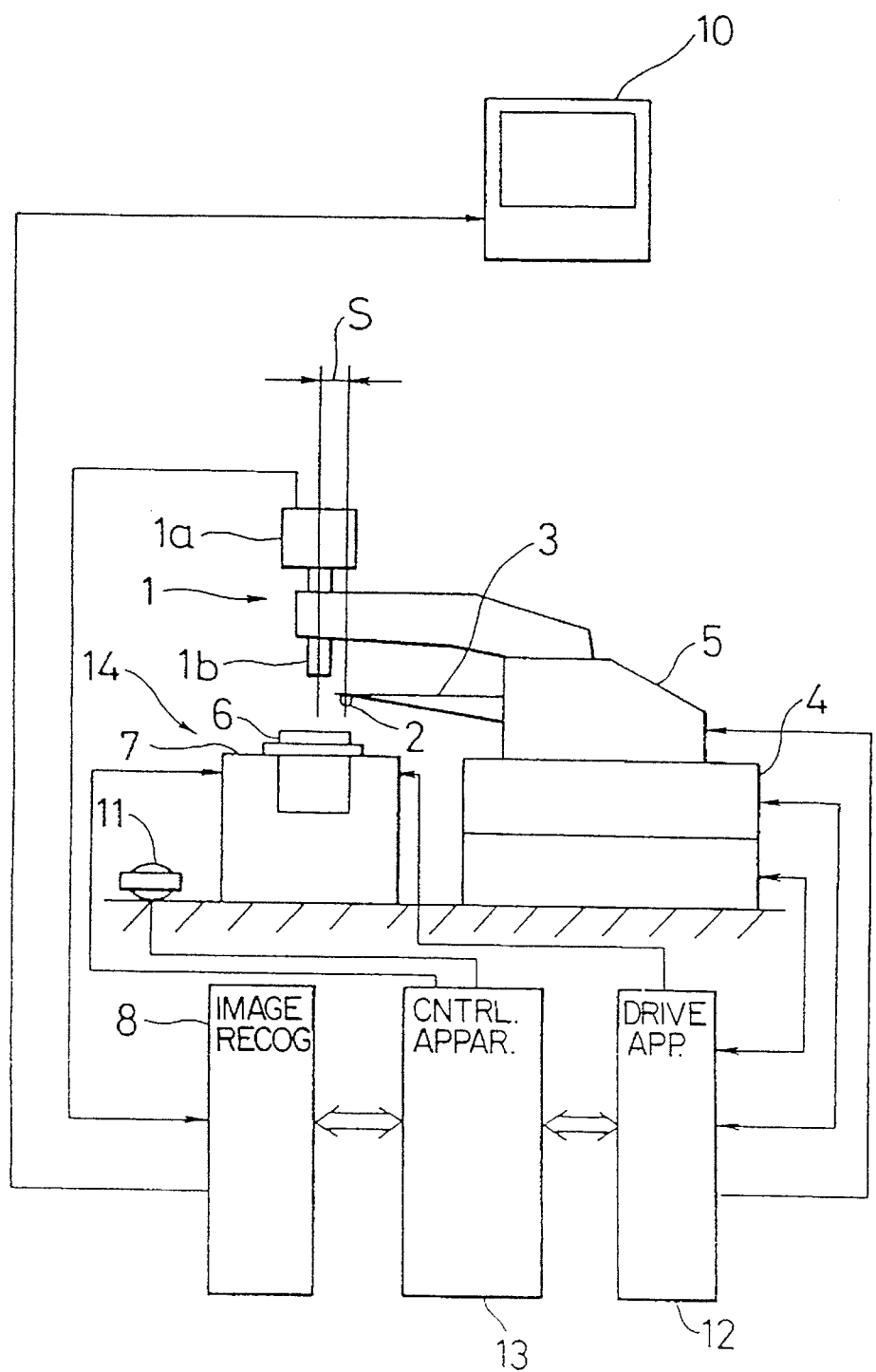
FIG. 1 is a schematic drawing showing the constitution of the wire bonder as claimed in the present invention.

As shown in FIG. 1, this bonder is composed of a photographic device in the form of camera 1 equipped with camera head 1a, lens 1b and so forth, bonding head 3 which includes capillary 2 and so forth that perform bonding, XY table 4 that allows horizontal two-dimensional movement of the above-mentioned camera 1 and bonding head 3 in the X and Y directions, bonding stage 7 which positions a semiconductor component in the form of IC chip 6 that is photographed by the above-mentioned camera 1, image recognition apparatus 8 which receives the output from the above-mentioned camera 1, a display device in the form of monitor 10 which receives the output from the above-mentioned image recognition apparatus 8, a control device in the form of control apparatus 13 which includes a microprocessor that receives the output from the above-mentioned image recognition apparatus 8 and generates a control signal to manipulator 11 or a drive device in the form of drive apparatus 12, a drive mechanism 5 equipped on the above-mentioned XY table 4 which receives a drive signal from the above-mentioned drive device in the form of drive apparatus 12 and drives the above-mentioned bonding head 3 in the Z direction, a transport device in the form of transport apparatus 14, and so forth. Furthermore, the above-mentioned camera 1 may be equipped with an auto-focus mechanism. In addition, since the above-mentioned image recognition apparatus 8, control apparatus 13, drive apparatus 12 and so forth may be equipped functionally, they may be composed in the form of a single apparatus instead of separate apparatuses.

Figure 2:
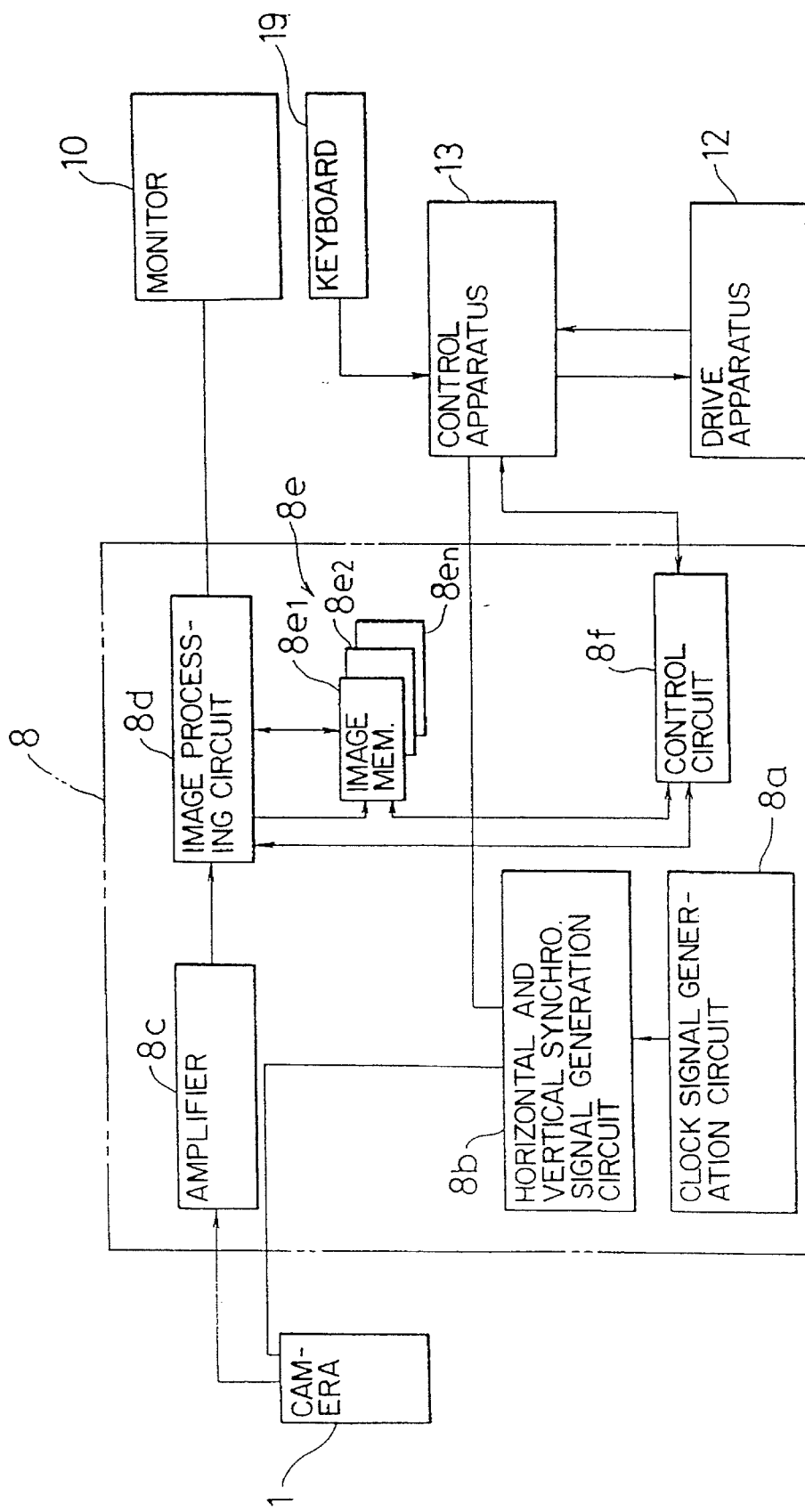
FIG. 2 is a block diagram showing the circuit constitution of the image recognition apparatus, control apparatus and so forth shown in FIG. 1.
Figure 3:
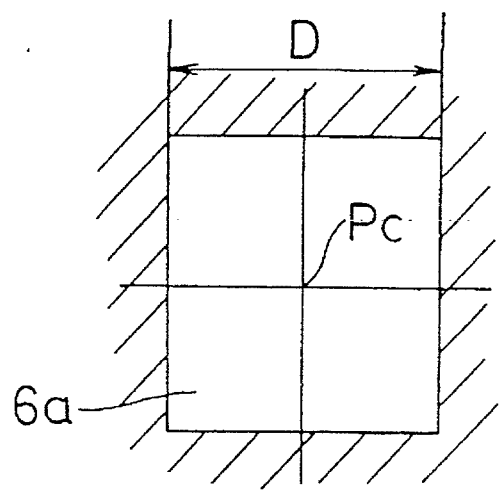
FIG. 3 is an overhead view showing an image of an electrode (pad) portion taken with a camera.
Figure 4:
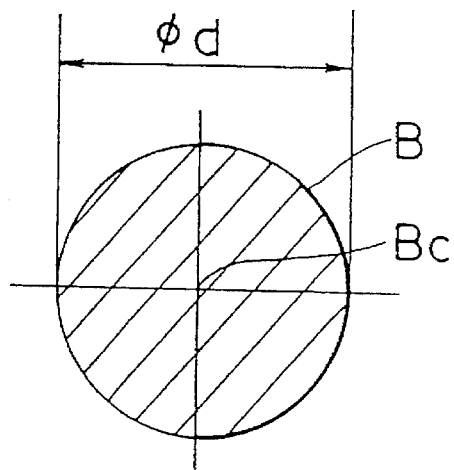
FIG. 4 is an overhead view showing an image of a ball taken with a camera.

As shown in FIG. 2, image recognition apparatus 8 is composed of clock signal generation circuit 8a, horizontal and vertical synchronizing signal generation circuit 8b, image processing circuit 8d, which performs image processing by digitizing video signals from camera 1 amplified with amplifier 8c, control circuit 8f, which controls and evaluates said image processing circuit 8d, and image memory 8e ($8e_1$–$8e_n$), which accumulates image data relating to bonded sites, namely image data relating to electrode (pad) 6a, that relating to ball B or that relating to a lead and so forth. This image recognition apparatus 8 and camera 1 are generically referred to as a recognition device. In addition, as shown in FIG. 2, keyboard 19 in the form of an operating device is for issuing commands for setting each of the various condition settings in control apparatus 13. For example, this keyboard can be used to set the ball diameter of the initial ball, namely the diameter before bonding, and so forth. Furthermore, FIG. 3 shows a digitized image of the pad, while FIG. 4 shows a digitized image of the ball.

The following provides an explanation of a transport device in the form of transport apparatus 14 which transports lead frames L/F and so forth recognized by the above-mentioned recognition device.

Figure 5:
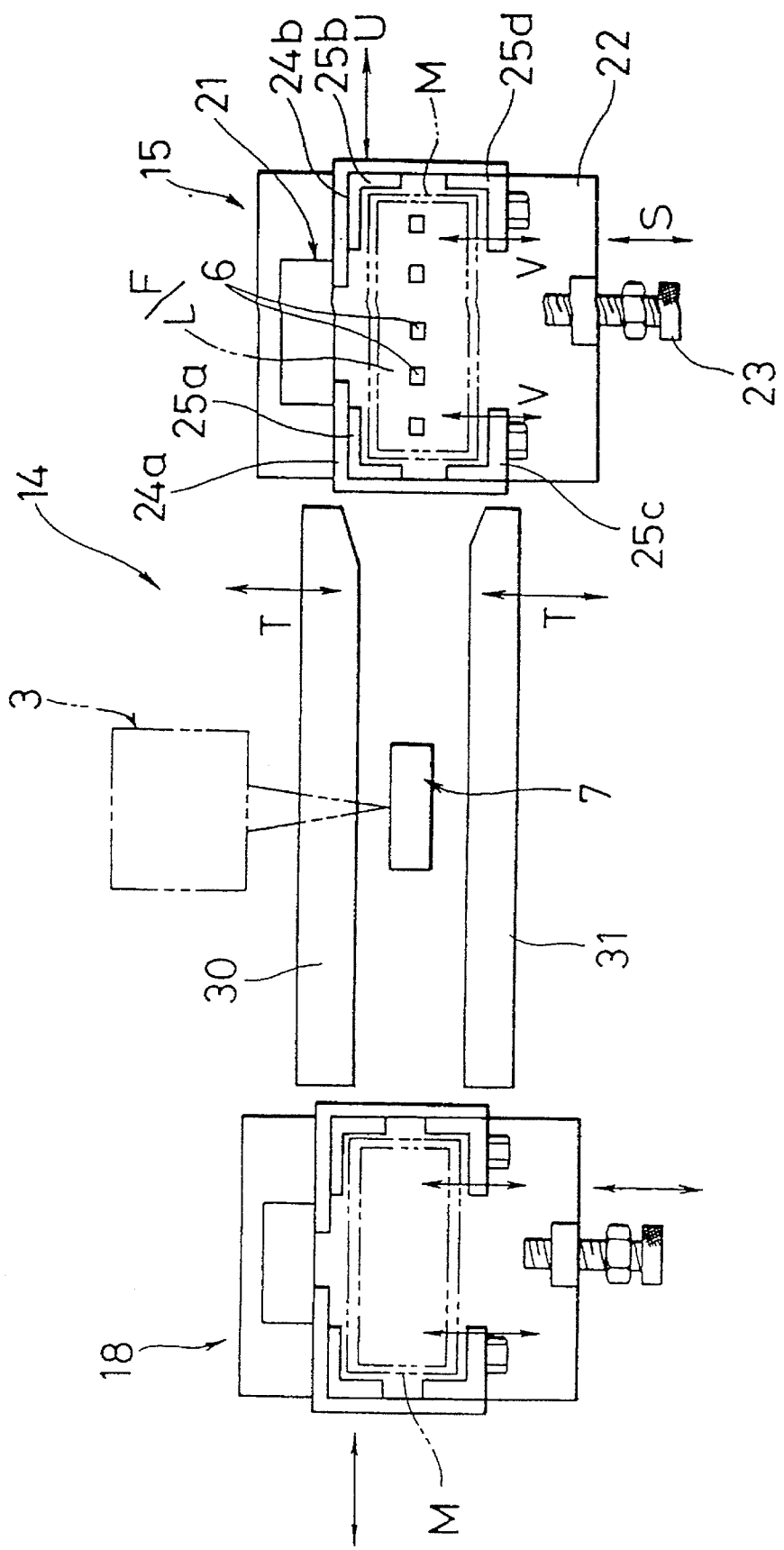
FIG. 5 is an overhead view showing a summary of the transport apparatus as claimed in the present invention.
Figure 6:
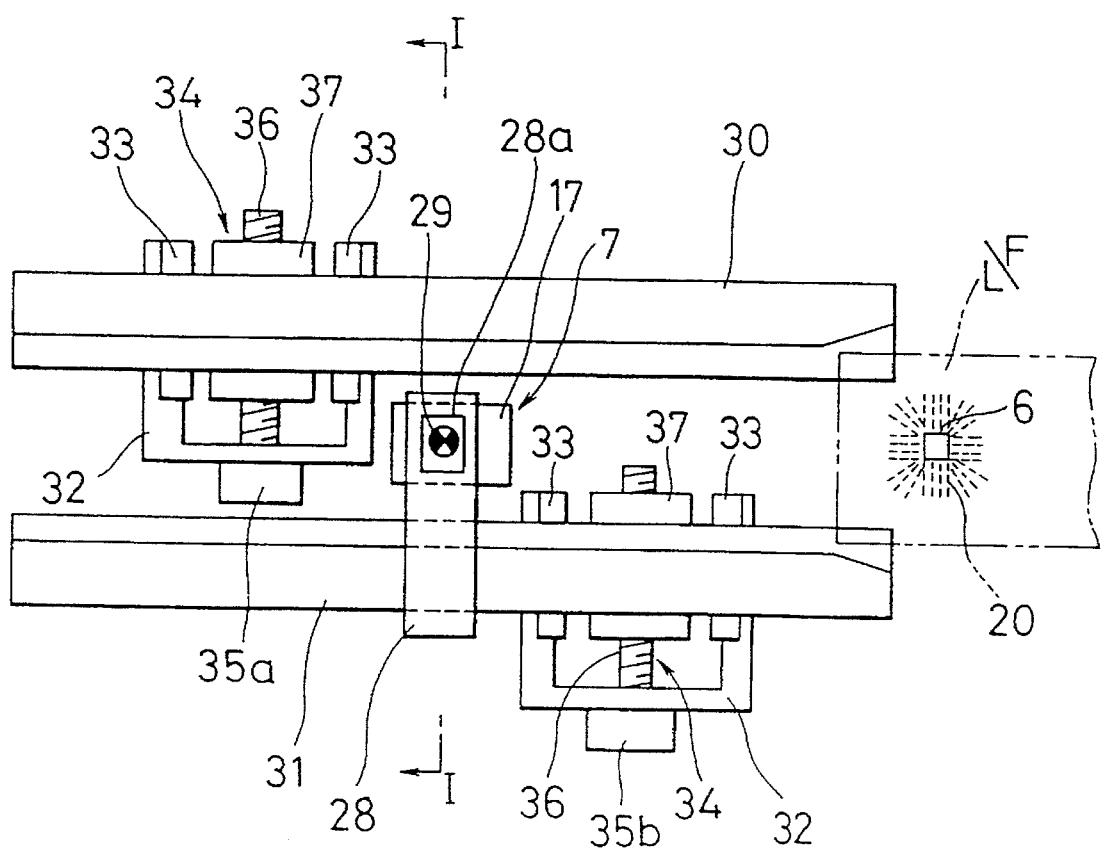
FIG. 6 is a drawing as viewed from above the transport path of FIG. 5.
Figure 7:
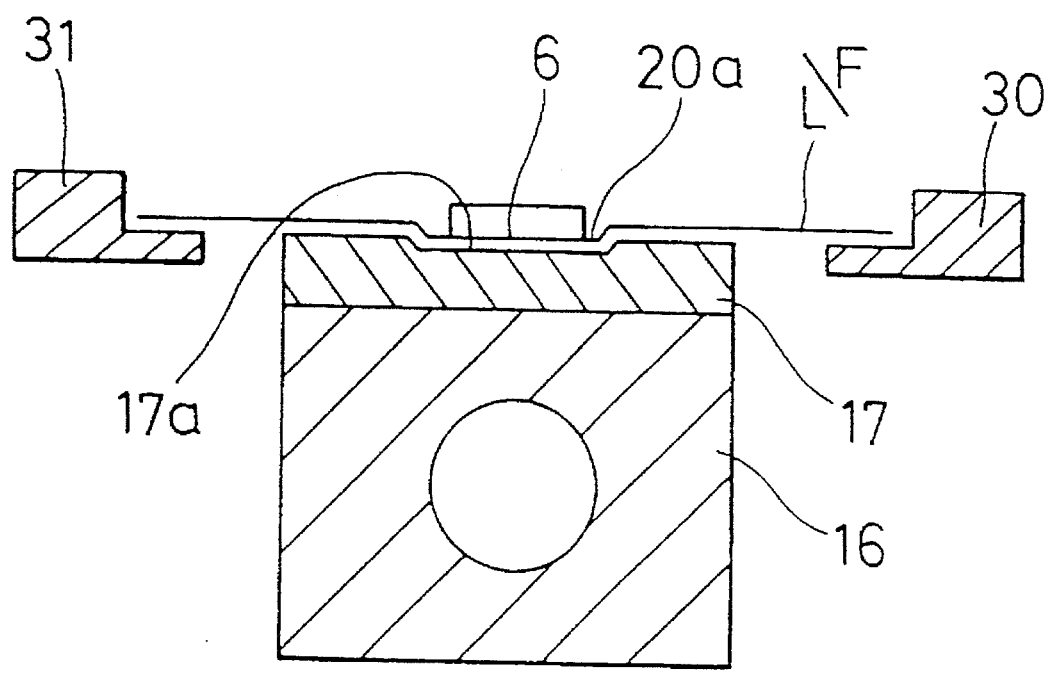
FIG. 7 is a longitudinal cross-sectional view as viewed from direction I—I of FIG. 6.

As shown in FIGS. 5 through 7, in this bonder, a plurality of substrates in the form of lead frames L/F, on which each of a plurality of IC chips 6 are mounted arranged in a row in the lengthwise direction, are arranged and contained within a substrate containment device in the form of magazine M, and this magazine M is placed on loader 15. Accompanying movement of said loader 15, these lead frames L/F are sequentially taken out of magazine M by a frame feeding device not shown, intermittently fed at intervals of the arrangement pitch of IC chips 6, and transported onto heater plate 17 which is heated by heater block 16 (see FIG. 7). On said heater plate 17, each IC chip 6 mounted on said lead frame L/F and lead 20 formed on said lead frame (see FIG. 6) are sequentially connected by bonding using a conductive wire. Those lead frames L/F on which the above-mentioned bonding has been performed are further advanced by the above-mentioned frame feeding device and contained in empty magazine M placed on unloader 18. A transport path that performs high-precision transport to prevent snaking of lead frames L/F transported by this frame feeding device is composed of guide members in the form of a pair of guide rails 30 and 31 arranged corresponding to both sides of lead frames L/F.

However, since lead frames L/F have various widths corresponding to the type of IC chip 6 which is to be mounted, the interval between both guide rails 30 and 31 is adjustable to allow guiding of these various types of lead frames. More specifically, as shown in FIG. 6, a pair of frame bases 32 are mounted on the frame of the wire bonder (not shown), and each guide rail 30 and 31 is attached to a slider 33 able to slide freely along a rail portion provided on each frame base 32.

Guide member driving device 34 is provided for moving each of both guide rails 30 and 31. As a result, both guide rails 30 and 31 are moved together and apart with respect to lead frame L/F by the operation of said guide member driving device 34. Furthermore, said guide member driving device 34 is composed of pulse motors 35a and 35b mounted on the above-mentioned frame bases 32, male screw 36 coupled to the output shaft of said pulse motor, and nut 37 fastened to both guide rails 30 and 31 which screws onto said male screw 36.

The following provides an explanation of loader 15 and unloader 18 arranged so as to be located on both sides of the above-mentioned guide rails 30 and 31. Furthermore, since loader 15 and unloader 18 mutually have similar constitutions, a detailed explanation is provided only for the constitution of loader 15, with that for unloader 18 omitted.

As shown in FIG. 5, loader 15 has an elevator mechanism 21 for lowering or raising magazine M at intervals of the arrangement pitch of lead frames L/F in order to take out a plurality of lead frames L/F arranged and contained in said magazine M one at a time with the above-mentioned frame feeding device (not shown), and elevator mechanism base 22 equipped with said elevator mechanism 21. This elevator mechanism base 22 moves in the direction shown by arrow S, namely the direction parallel to direction of movement T of the above-mentioned both guide rails 30 and 31, and its position can be adjusted in said direction S by turning knob 23.

A pair of stocker guides 24a and 24b, formed to each have a cross-section in the shape of the letter "L", are provided on elevator mechanism base 22. One stocker guide 24a is anchored on elevator mechanism base 22, while the position of the other stocker guide 24b can be adjusted in the direction shown by arrow U, namely the lengthwise direction of magazine M.

Two each, for a total of four, restricting members 25a–25d are attached to the insides of both of the above-mentioned stocker guides 24a and 24b. These restricting members 25a–25d engage with magazine M to restrict its movement. Two restricting members 25a and 25b are each fastened to stocker guides 24a and 24b, while the position of the other two restricting members 25c and 25d can be adjusted in the direction shown by arrow V, namely the direction of the width of magazine M.

The following provides an explanation of operation in the apparatus having the above-mentioned constitution in the case of performing adjustment of the transport path so as to match the width of lead frames L/F to be handled in said apparatus.

To begin with, pulse motors 35a and 35b (see FIG. 7) are rotated and driven based on a command signal emitted from control apparatus 13 consisting of a microprocessor and so forth. The amount of rotation of said pulse motors is converted into the amount of advance or regression of nut 37 resulting in both guide rails 30 and 31 moving to the movement limit position in the direction in which they move away from each other.

Next, a single lead frame L/F for adjustment of the transport path is handled by an operator, and a reference hole (not shown) formed in said lead frame L/F is fit onto a projection (not shown) that serve as a reference provided on heater plate 17. As a result, island 20a formed in lead frame L/F in which IC chip 6 is mounted aligns with recess 17a (see FIG. 7) of heater plate 17.

Furthermore, as shown in FIG. 6, lead frame L/F is held by pressing from above by lead frame clamp 28, and bonding origin 29 is set in the center of IC chip 6 and island 20a through opening 28a of said lead frame clamp 28 by operating bonding head 3.

Following this procedure, pulse motors 35a and 35b are rotated in reverse so that both guide rails 30 and 31 approach lead frame L/F. Moreover, the gaps between the sides of said both guide rails and lead frame L/F are set to an optimum value.

Next, magazine M, containing a large number of the above-mentioned lead frames L/F is placed on loader 15 and said magazine M is restricted by an operator manually performing each of the positional adjustments of stocker guide 24b and restricting members 25c and 25d. Furthermore, at this time, the position of said restricted magazine M is adjusted in the direction of width so that lead frames L/F protruding from this magazine M smoothly enter between both guide rails 30 and 31. This positional adjustment is performed by an operator suitably turning knob 23 (see FIG. 5) to adjust the position of elevator mechanism base 22 equipped with each of the above-mentioned restricting members. In addition, aside from the above procedure, adjustment is made to provide clearance between each of restricting members 25a–25d and magazine M so that raising and lowering operation of magazine M by elevator mechanism 21 is performed smoothly. Adjustment similar to that of the above-mentioned loader 15 is also performed for unloader 18. This then completes adjustment of the transport path.

The following provides an explanation of bonding head 3 and the constitution including drive mechanism 5 which performs drive in the Z direction. Furthermore, in the present embodiment, the constitution including bonding arm 41 and oscillating arm 42 is explained as bonding head 3, while the constitution including oscillating frame 56 is explained as drive mechanism 5. These are generically referred to as a bonding device.

Figure 8:
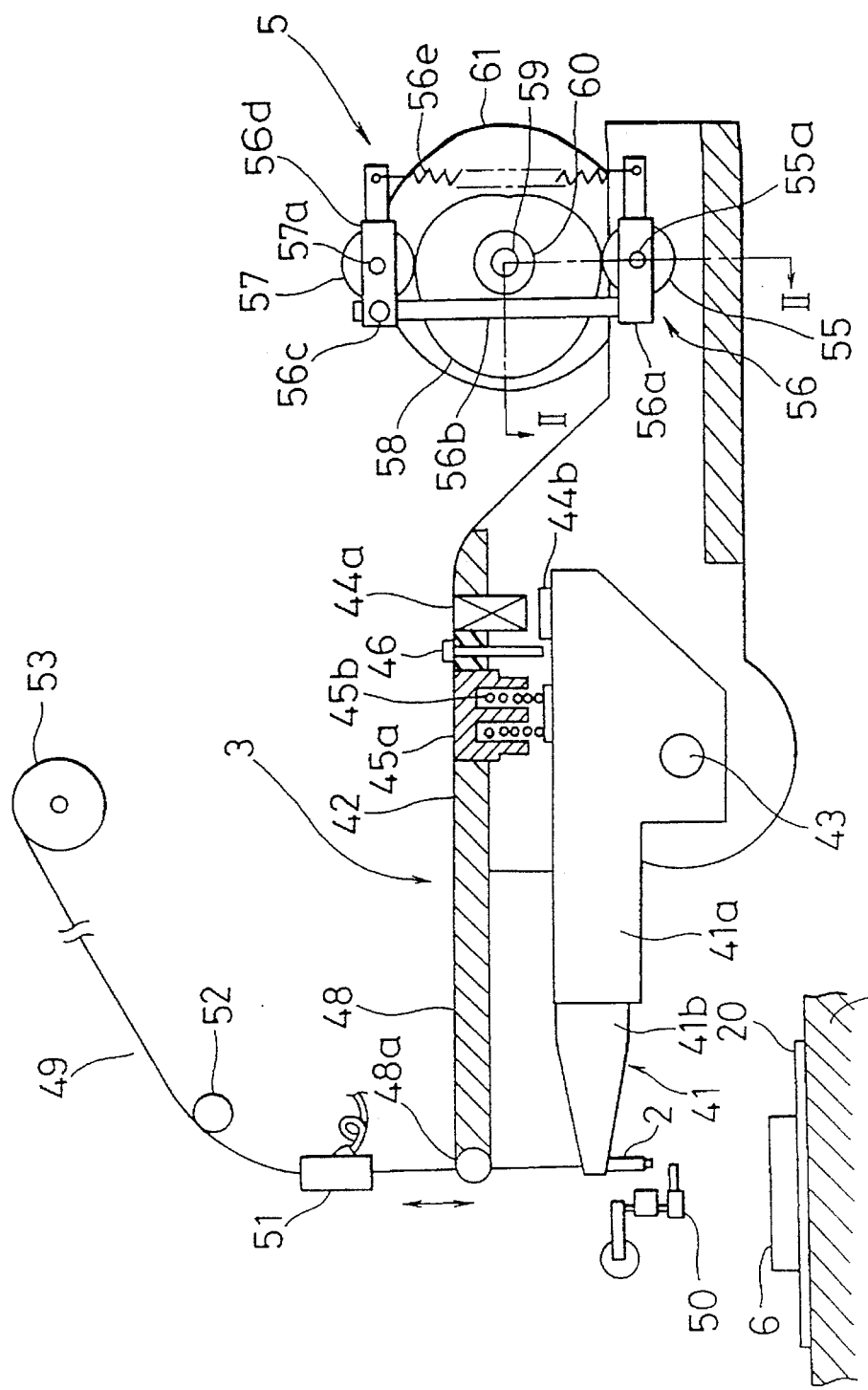
FIG. 8 is a drawing showing a summary of the constitution of the bonding device, including the bonding head and drive mechanism, as claimed in the present invention.
Figure 9:
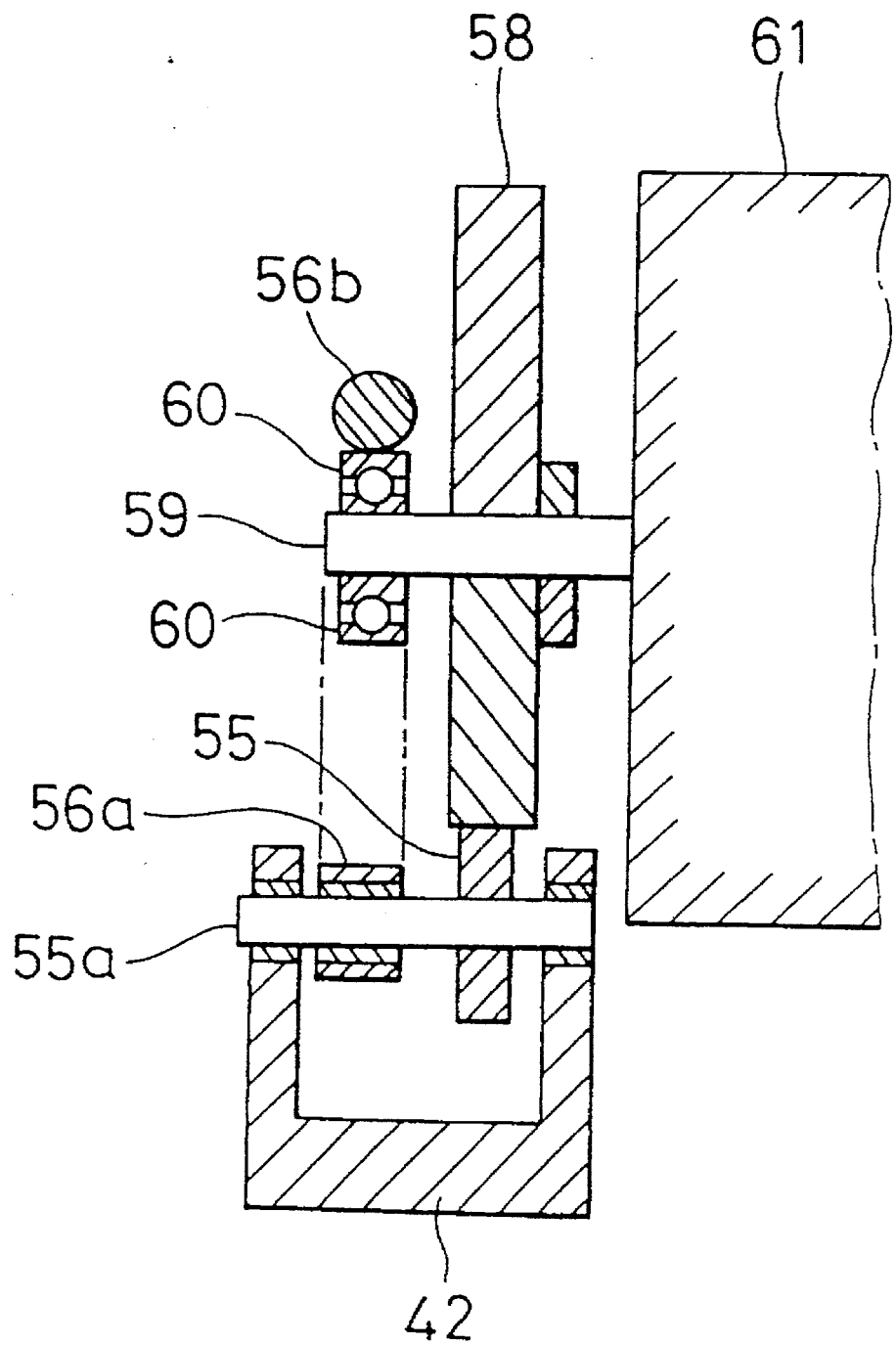
FIG. 9 is a cross-sectional view taken along line II—II of FIG. 8.

In this bonder, bonding arm 41, consisting of holding frame 41a and horn 41b, is able to oscillate around the shaft center of support shaft 43 together with oscillating arm 42 as shown in FIG. 8. This bonding arm 41 is securely fit onto support shaft 43, and oscillating arm 42 is fit onto support shaft 43 so as to oscillate freely. This support shaft 43 is equipped on an XY table and so forth not shown able to move two-dimensionally. Furthermore, an ultrasonic vibrator (not shown) for applying vibrations to horn 41b is incorporated within holding frame 41a. Solenoid 44a and electromagnetic adsorption piece 44b are mounted in opposition to each other on oscillating arm 42 and holding frame 41a, respectively. When bonding arm 41 is oscillated, current is supplied to solenoid 44a from a power supply not shown. As a result of adsorption force then being produced between solenoid 44a and electromagnetic adsorption piece 44b, said bonding arm 41 and oscillating arm 42 are mutually coupled in a fixed state. However, an adjustable stopper 46, held in place by screws and so forth is provided on oscillating arm 42 to prevent adsorption in excess of a prescribed distance. In addition, magnet 45a and coil 45b are respectively mounted on oscillating arm 42 and holding frame 41a at a location to the front of the above-mentioned electromagnetic adsorption device. Magnet 45a and coil 45b compose a device that produces adsorption force for maintaining the end of bonding arm 41, namely the site where the bonding tool in the form of capillary 2 is held, downward as shown in FIG. 8.

In addition, clamp arm 48 is provided on the end of oscillating arm 42. A clamping device in the form of clamp 48a, for gripping wire 49 by an opening and closing mechanism not shown composed of a solenoid, spring and so forth, and for cutting said wire 49 using a method to be described later, is provided on the end of said clamp arm 48. In addition, an electrical discharge device in the form of electric torch 50 is arranged below capillary 2 on a vertical shaft not shown so as to be able to rotate by the action of an actuator and so forth. Said electric torch 50 is of a constitution such that it is able to rotate around capillary 2 accompanying movement of bonding arm 41. This electric torch 50 forms a ball on the end of wire 49 by applying a prescribed voltage. In addition, an air tension device 51 is arranged above clamp 48a supported on a frame not shown. Said air tension device 51 applies a prescribed amount of tension to wire 49 by blowing air on said wire 49 to keep it straight to the end of capillary 2 of bonding arm 41 at all times. This wire 49 is further wound onto spool 53 via guide 52. As a result of the above-mentioned air tension device 51 blowing air through a nozzle as shown in FIG. 8, a prescribed amount of tension can be applied to wire 49. In addition, wire 49 can be fed out in the downward direction of FIG. 8 by suctioning through a nozzle of air tension device 51.

As is also shown in FIG. 8, support shaft 55a is provided on the rear end of oscillating arm 42. Arm-side cam follower 55 and oscillating base 56a are allowed to rotate freely around this support shaft 55a. One end of bearing guide 56b is mounted on oscillating base 56a, and pre-loading arm 56d is attached to the other end of bearing guide 56b via support pin 56c so as to be able to rotate freely. Support shaft 57a is provided on the free end of pre-loading arm 56d, and cam follower 57 is attached to said support shaft 57a so as to be able to rotate freely. A tensile spring in the form of pre-loading spring 56e is spread between the end of the pre-loading arm 56d and the end of oscillating base 56a, and arm-side cam follower 55 and cam follower 57 are pressed onto a cam surface in the form of the external surface of cam 58 formed roughly into the shape of a heart. Furthermore, the two contact points with respect to arm-side cam follower 55 and cam 58 of cam follower 57 are located on both sides of the center of rotation of said cam 58.

A frame structure is formed by this oscillating base 56a, bearing guide 56b and pre-loading arm 56d. This frame structure is generically referred to as oscillating frame 56. A constituent member of oscillating frame 56 in the form of bearing guide 56b makes contact with the contour of radial bearing 60 attached on cam shaft 59 onto which cam 58 is fit. Furthermore, cam 58 rotates by torque applied to cam shaft 59 by motor 61. In addition, the height of a bonding tool in the form of capillary 2 is detected by a rotary encoder not shown coupled to support shaft 43.

Normally, in order to perform bonding between pad 6a of IC chip 6 and lead 20 in the bonder having the above-mentioned constitution, wire 49 is held with a bonding tool in the form of capillary 2 provided on the end of bonding arm 41, said wire 49 is brought into contact with the surface of the target pad or lead, and a portion of the wire in which a ball is formed on the end using said capillary is crushed followed by its deposition by thermocompression bonding. At this time, there are also cases in which ultrasonic vibrations are simultaneously applied to the end of the wire.

The following provides an explanation of the process by which this wire bonding is performed according to the steps shown in FIGS. 10(a)–10(h), which correspond to steps (1)–(8), respectively. When wire bonding is to be performed on pad 6a on IC chip 6 placed on bonding stage 7, capillary 2, through which wire 49, having an initial ball formed on its end by an electrical discharge device not shown, is passed, is positioned by movement of an XY table able to move two-dimensionally based on the information from a camera 1 shown in FIG. 1. Following this positioning, capillary 2 is lowered as indicated in steps (1) through (3) of FIGS. 10(a)–10(c) to crush the ball onto the above-mentioned pad 6a and perform thermocompression bonding.

In this process, bonding arm 41 shown in FIG. 8 is lowered and moved at high speed from step (1) to step (2), and moved at low speed from step (2) to step (3). Clamp 48a is open at this time. Next, when connection to a first bonding point is completed, bonding arm 41 is raised upward, namely the direction of the Z axis indicated in FIG. 8, with clamp 48a remaining open from step (3) to step (4). Wire 49 is then pulled out with clamp 48a still open following a prescribed loop control as shown in step (5). This is then connected to a second bonding point in the form of lead 20 as shown in step (6).

Following this connection, clamp 48a closes after wire 49 has been pulled out by a prescribed feed amount f from the end of capillary 2 as indicated in step (7). While still in this state, wire 49 is cut as indicated in step (8) in the process of bonding arm 41 further rising to a prescribed height. Ball B is again formed on the end of the wire using an electrical discharge device in the form of electric torch 50 followed by returning to the state of step (1) with clamp 48a open. Wire bonding is thus performed by this series of steps.

However, although ordinary wire bonding can naturally be performed in a bonder having the constitution as described above, a characteristic of the bonder as claimed in the present invention is the equipping of said bonder with an automatic inspection function. The following provides an explanation of the automatic inspection function as claimed in the present invention. Furthermore, since this automatic inspection function can primarily be divided into automatic inspection functions for a first bonding point in the form of an IC chip, a second bonding point in the form of a lead, and a wire connected between said first and second bonding points, the following explanation is provided for each of those individual functions. Furthermore, in the case of performing wire bonding using a bonder, self-teaching is performed which sets the various conditions and data of the coordinate positions of a first bonding point in the form of pad 6a on IC chip 6 and a second bonding point in the form of a lead 20 and so forth. Thus, preliminary data for bonding is stored in memory, including various image data stored in memory $8e$ ($8e_1$ to $8e_n$) and various positional data and so forth stored in control apparatus 13.

Therefore, the following provides an explanation of an automatic inspection function in the case of performing wire bonding using the bonder as claimed in the present invention.

Figure 11:
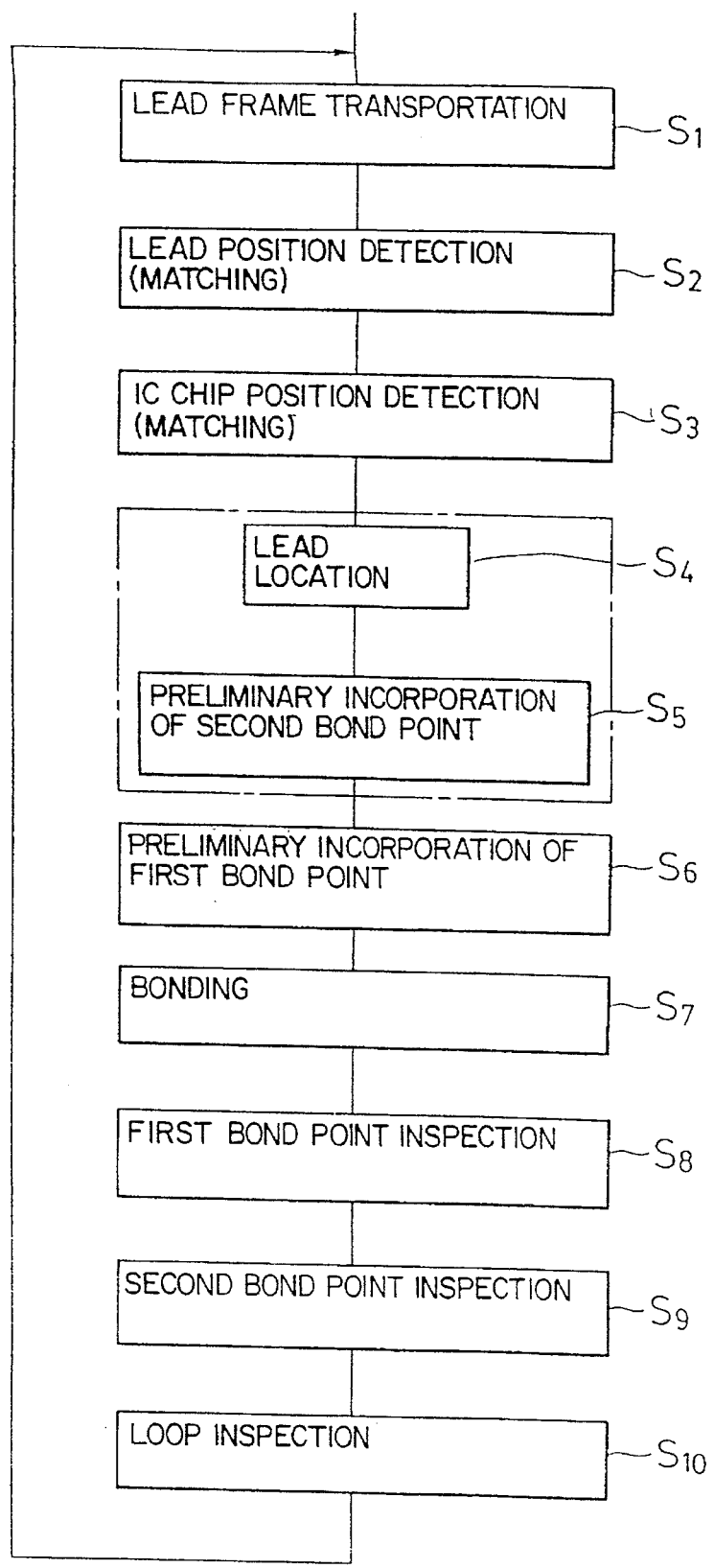
FIG. 11 is a flow chart showing the process by which automatic detection is performed using the wire bonder as claimed in the present invention.

To begin with, as shown in FIG. 11, lead frame L/F is transported onto the bonding stage from loader 15 (shown in FIG. 5) (Step $S_1$). When this is completed, lead frame L/F is positioned by lead frame clamp 28 shown in FIG. 6. Next, control apparatus 13 shown in FIG. 1 drives drive apparatus 12 based on position data stored in memory in advance, namely the coordinate position data of transported lead frame L/F and moves XY table 4. A second bonding point in the form of lead 20 is then photographed by camera 1 positioned over said lead frame L/F, and the image of said lead 20 is incorporated. Image recognition apparatus 8 matches the reference position data of lead 20 stored in memory in advance with the image data newly incorporated into memory $8e$ and performs positional correction of the entire lead within the lead frame (Step $S_2$). This involves, for example, correction of any deviation in the horizontal two-dimensional directions of direction X and direction Y. IC chip 6 is also photographed and that image is stored in memory $8e$. Image recognition apparatus 8 then matches the reference positional data of IC chip 6 stored in memory in advance with the positional data of IC chip 6 newly incorporated into memory $8e$, and then corrects any deviation of IC chip 6 (Step $S_3$). This involves, for example, performing positional corrections by determining the location between two points of IC chip 6. Since the location of pad 6a within IC chip 6 has also been stored in memory in advance, by performing positional correction of this IC chip 6, the location of pad 6a is also corrected simultaneously.

Next, in Step $S_4$, the location of lead 20 of the lead frame L/F corrected in the above-mentioned Step 2 by control apparatus 13 is determined, and the amount of deviation from the reference lead location stored in memory in advance in control apparatus 13 is determined. Each location for each lead 20 to be bonded is then determined (Step $S_4$).

Following completion of the processes of the above-mentioned Steps $S_1$ through $S_4$, ordinary bonding (Step $S_7$) is performed.

However, the bonder having an automatic inspection function as claimed in the present invention also performs the following processes. Namely, simultaneous to determining the coordinate position of a second bonding point (second bond point) during lead location of Step $S_4$, preliminary incorporation of the image of lead 20 is performed and stored in either of memories $8e_1$ through $8e_n$ of image recognition apparatus 8 (Step $S_5$). Although this image may be stored for each lead of the above-mentioned lead 20, it may be incorporated into memory for at least one area, namely for each lead of a plurality of leads. In addition, although this preliminary incorporation of a second bond point (Step $S_5$) may be performed during lead location as in the present embodiment, it may also be performed in a different step.

Next, when this second bond point preliminary incorporation (Step $S_5$) is performed, preliminary image incorporation of a first bond point, namely pad 6a of IC chip 6, is performed and stored in either of memories $8e_1$ through $8e_n$ of image recognition apparatus 8 (Step $S_6$). Although this data may be stored for each of the above-mentioned pads 6a of IC chip 6, it may be incorporated into memory for at least one area, namely a plurality of pads. Following completion of these steps $S_1$ through $S_6$, bonding is performed (Step $S_7$). Furthermore, since it is only required that incorporation of data for lead location and preliminary incorporation of first and second bond points be performed, data for a first bond point may be incorporated first.

Next, after bonding is completed, inspection is performed after the image of the first bond point is incorporated (Step $S_8$). Next, the image of the bond point is incorporated again and an inspection is also performed (Step $S_9$). Following this inspection, a loop inspection is performed on the wire between the first bonding point and second bonding point (Step $S_{10}$) to perform a series of automatic inspections. Once the above-mentioned series of inspections is completed, the next lead frame L/F is transported and a similar operation is performed. Furthermore, since it is only required that inspection of the first and second bonding points and the loop inspection be performed, these inspections need not be performed in the order as shown in FIG. 11.

Although the automatic inspection function of the bonder as claimed in the present invention is composed of the above-mentioned series of processes, this automatic inspection function can be used to perform inspections in a bonding process using various methods, such as by automatically performing inspections after predetermining a specified number of bonding operations or performing bonding inspections at fixed intervals of time and so forth.

Figure 12:
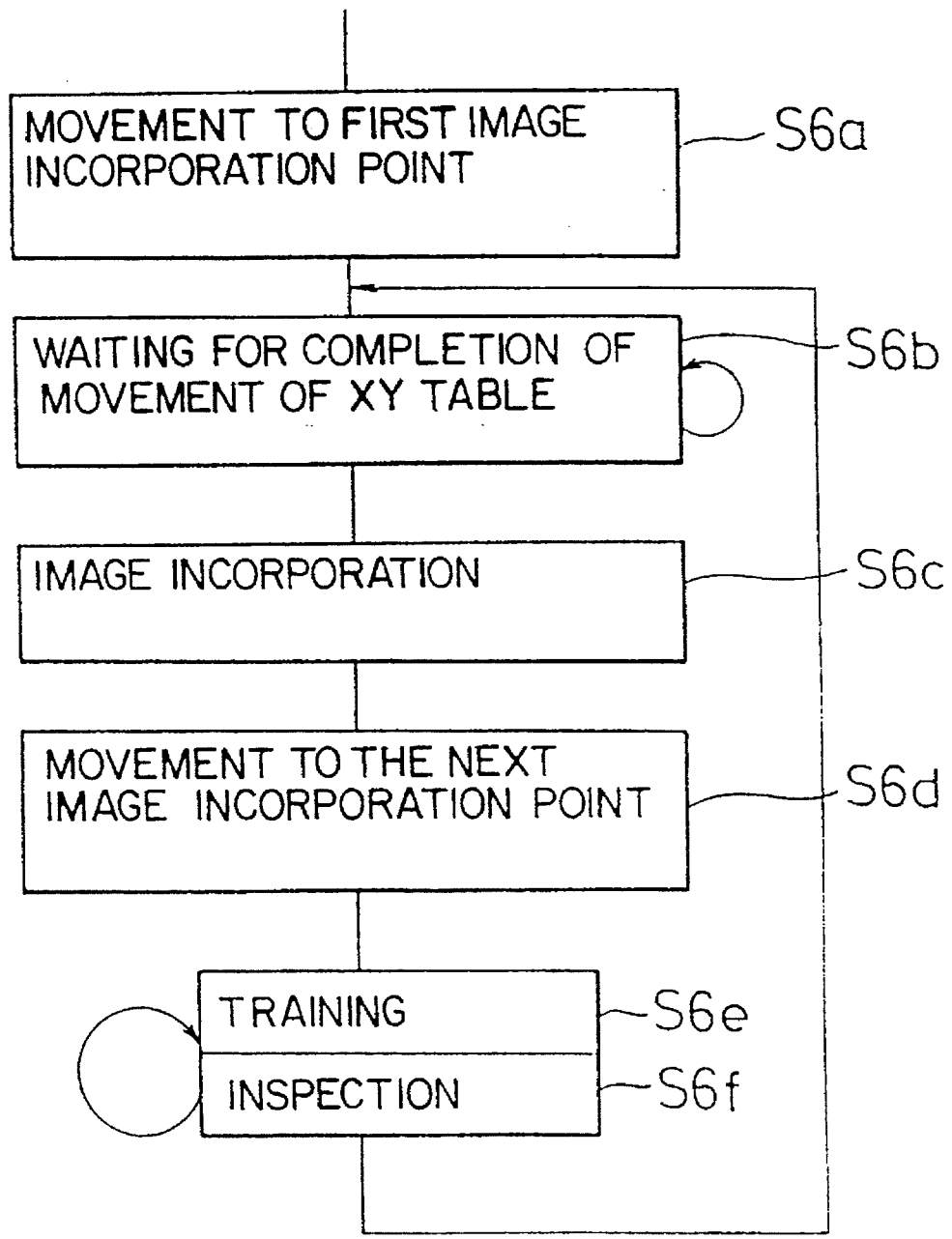
FIG. 12 is a flow chart showing the preliminary incorporation and inspection process shown in FIG. 11.

FIG. 12 shows the details of the image incorporation and inspection sequence shown in FIG. 11. For example, if the entire pad 6a is not contained within the image in the case of photographing a first bonding point in the form of said pad 6a on IC chip 6 (or a second bonding point in the form of a lead), the pad is photographed that lies within a specific image area.

To begin with, in Step $S_{6a}$, camera 1 moves to a first image incorporation point followed by waiting for completion of movement of the XY table (Step $S_{6b}$). Next, a specific image is incorporated (Step $S_{6c}$) after which said camera 1 begins to move to the next image incorporation point (Step $S_{6d}$). Next, training is performed in Step $S_{6e}$, namely the image incorporated in the above-mentioned Step $S_{6c}$ is stored in memory $8e$ ($8e_1$–$8e_n$). High-speed processing is performed by moving to the next image point in Step $S_{6d}$. A similar process is then repeated until the process is completed for all pads (or leads) by returning to Step $S_{6b}$. The above-mentioned preliminary incorporation is performed for each pad side and lead side. Furthermore, said preliminary incorporation proceeds in accordance with a predetermined number of pads or leads when so specified.

Next, although the inspection shown in FIG. 11 (Steps $S_8$–$8_{10}$) refers to the inspection process performed after bonding, a process similar to the above-mentioned Steps $S_{6a}$–$S_{6d}$ are repeated for each inspection process followed by performing the inspection in Step $S_{6f}$. This inspection is repeated for the above-mentioned image area, namely the entire wire portion within a single image (an entire wire portion refers to the pad, lead and wire connected to them), an inspection is then performed within the next image area following completion of the above-mentioned inspection, and this process is repeated until inspections have been completed for all wires. In addition, this wire inspection may be performed only on a specified number of wires or a single specified wire instead of on all wires. This inspection is performed for each pad side, lead side and loop following the process shown in FIG. 11.

Furthermore, in the case the recognition device including camera 1 and image recognition apparatus 8 is of high accuracy, preliminary incorporation as claimed in the present invention need only be performed by photographing only the state after bonding followed by recognition and inspection. Thus, the preliminary incorporation shown in FIG. 11 (Steps $S_5$–$S_6$) can be omitted thus resulting in greater processing speed.

Although the above has provided an explanation of the series of inspection processes as claimed in the present invention shown in FIGS. 11 and 12, since the automatic inspection function as claimed in the present invention can be broadly divided into inspections for a first bonding point, second bonding point and loop, the following provides a sequential explanation of the details of those inspections. Furthermore, although the following explanation is provided assuming a pad to be the first bonding point and a lead to be the second bonding point as a general rule, these can naturally be in the reverse order.

A. Inspection at a First Bonding Point (1) Ball Presence Inspection

Figure 13:
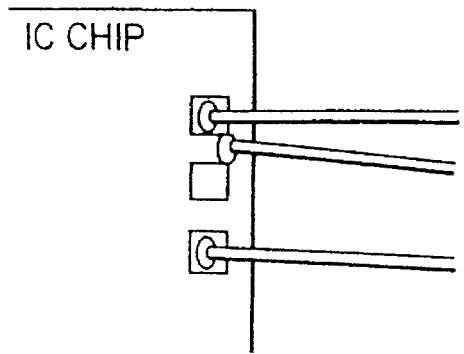
FIG. 13 is a drawing showing the state of performing a ball presence inspection using the wire bonder as claimed in the present invention.

An evaluation is made as to the presence or absence of a ball which is bonded at the location of a first bonding point following photography of a first bonding point in the form of pad 6a by camera 1. This evaluation is made with control circuit 8f shown in FIG. 2. Namely, in Step $S_6$ shown in FIG. 11, the image stored in memory by first bond point preliminary incorporation is recalled from memory $8e_1$ through $8e_n$ and compared with a newly incorporated image of pad 6a of a first bonding point. At this time, control circuit 8f detects whether or not there is a ball that has been bonded within a range specified from control apparatus 13. In the case in which bonding of ball B has shifted and is not bonded on pad 6a as shown in FIG. 13, the result of detection is judged to be defective. Control apparatus 13 then emits an alarm from an alarm apparatus not shown and/or notifies the operator using a notification device such as by displaying on monitor 10, followed by automatically stopping the apparatus.

(2) Inspection of Ball Compressed Diameter

In the present invention, the size of a ball bonded at a first bonding site is detected. In other words, the size of ball B (shown in FIG. 14) is photographed with camera 1 in a range specified from control apparatus 13 shown in FIG. 1. The ball dimensions in the X and Y directions are respectively detected, and that data is returned to control apparatus 13 via control circuit 8f. Control apparatus 13 then outputs the data from image recognition apparatus 8 after converting into, for example, μm units. Although the data here is obtained in the form of pixel data, it will hereinafter simply be referred to as data. In addition, this inspection is not performed in the case a ball is evaluated as being absent in the above-mentioned ball presence inspection. In addition, in the case of ball size not being within a certain range according to the result of detection, namely the ball size is not within a predetermined range as a result of, for example, performing bonding at a ball size entered from a keyboard, control apparatus 13 emits an alarm from an alarm apparatus not shown and/or notifies the operator using a notification device such as by displaying on monitor 10. In addition, even when ball size is within a predetermined range, in order to have this ball size approach the desired ball size, ball compression diameter data is fed back to control apparatus 13 followed by accumulation of effective data and statistical processing. Bonding parameters, including ultrasonic wave and load parameters, are then corrected and updated so that ball size becomes the desired ball compression diameter.

(3) Detection of Ball Location

Figure 14:
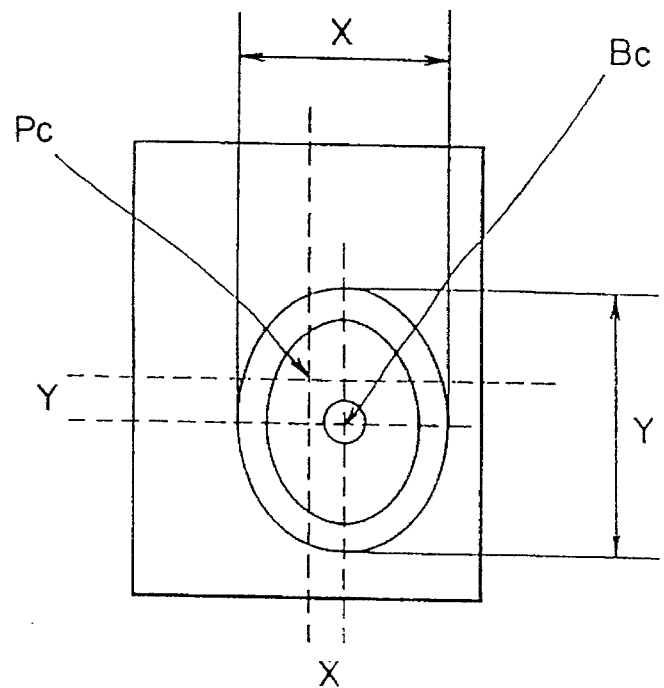
FIG. 14 is a drawing showing the state in which a ball is pressed onto a pad using the wire bonder as claimed in the present invention.

The first bonding location, namely the location of a ball bonded on pad 6a of IC chip 6, is detected. Camera 1 detects the location of the ball within a range specified from control apparatus 13, namely the amount of deviation in the X and Y directions from pad center Pc (said data is stored in memory in advance) as shown in FIG. 14, and that data is returned to control apparatus 13 via control circuit 8f. Ball center Bc is then determined from the data obtained by photography with camera 1. The amount of deviation in terms of XY coordinates of this ball center Bc from pad center Pc is determined and corrections are made so that both agree.

Figure 15:
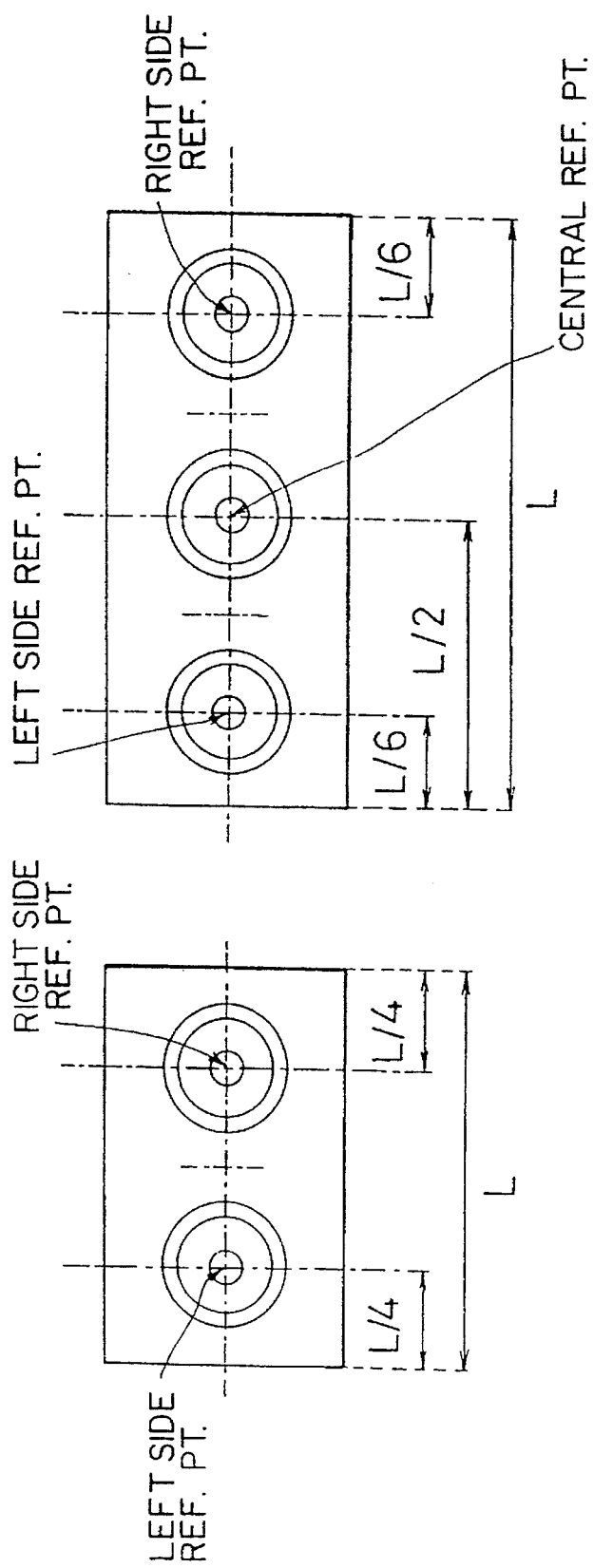
FIGS. 15(A) and 15(B) are drawings showing the state in which bonding is performed to rectangular pads using the wire bonder as claimed in the present invention.

However, in the case the above-mentioned pad 6a is not roughly a square, but rather a rectangular pad, the number of balls bonded on that pad is first detected as shown in FIG. 15. A reference point on the pad is then calculated according to that number of balls and the amount of deviation from that point is output. For example, in the case two bonds are made on the rectangular pad shown in FIG. 15(A), since the length in the horizontal direction of the pad is L, the reference point with respect to the ball on the left side is located at L/4 from the left edge, while the reference point with respect to the ball on the right side is similarly located at L/4 from the right edge. The amount of deviation from these reference points is then calculated. In addition, in the case of three bonds are made on the rectangular pad shown in FIG. 15(B), since the length L of the pad is stored in memory in advance, the amounts of deviation from the reference point with respect to the left ball, that with respect to the central ball and that with respect to the right ball are calculated. Other processing is similar to the case of two bonds described above.

In addition, in the case a first bonding point is a lead and so forth, since the pad is not detected, the amount of deviation is determined from the coordinate position specified from control apparatus 13.

This inspection is not performed in the case it was tentatively evaluated that there is no ball in the ball presence inspection. In the case the amount of ball deviation is determined to be outside a certain range according to the result of detection, control apparatus 13 emits an alarm from an alarm apparatus not shown and/or notifies the operator using a notification device such as by displaying on monitor 10, followed by automatically stopping the apparatus. Even if within a predetermined range, in order to have ball location approach the desired ball location, effective data is fed back to control apparatus 13 followed by accumulation and statistical processing.

Figure 18:
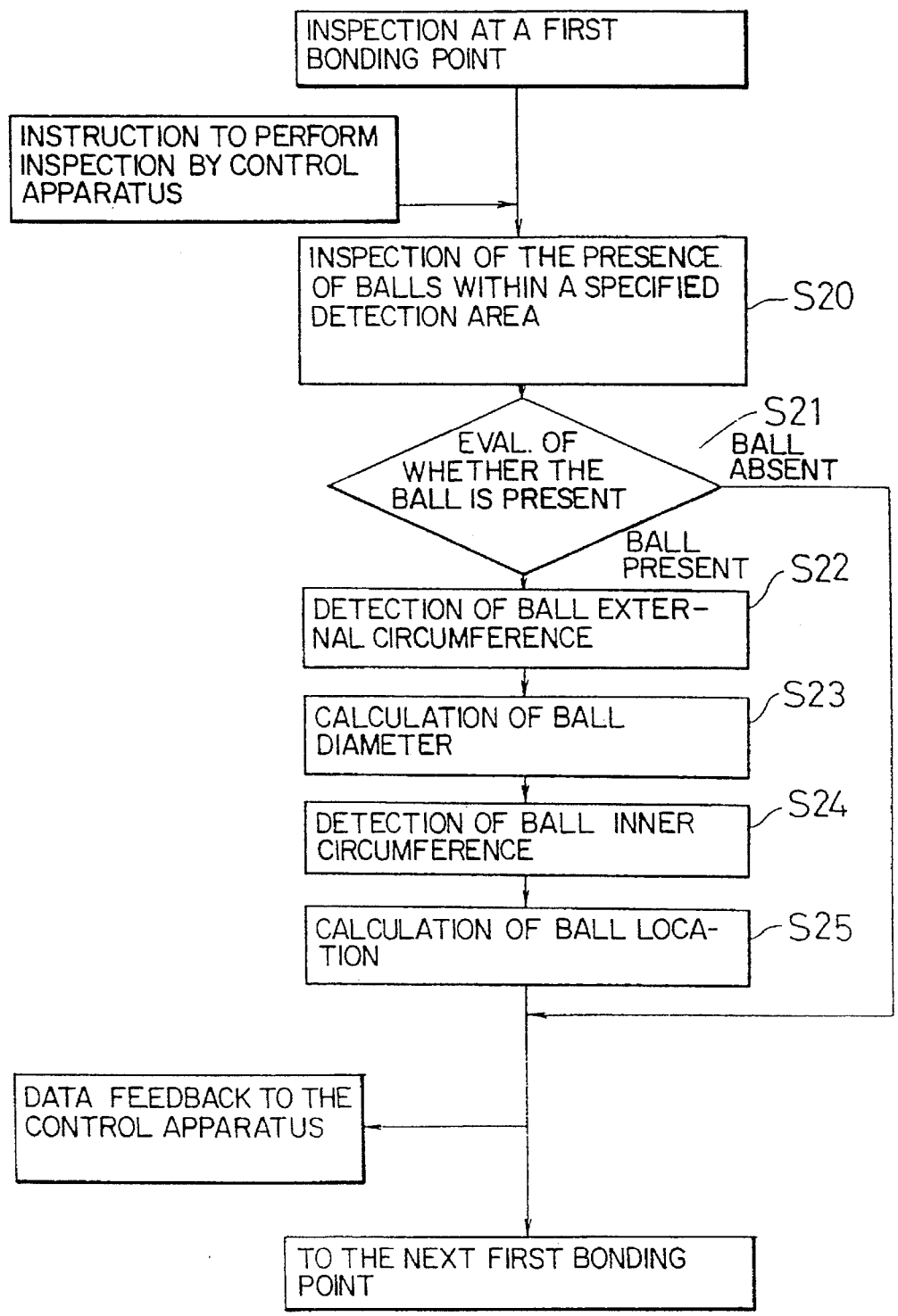
FIG. 18 is a flow chart showing the inspection process at a first bonding point using the wire bonder as claimed in the present invention.

(4) FIG. 18 is a flow chart showing the inspection sequence at a first bonding site. To begin with, when instructed to perform inspection of a first bonding site by control apparatus 13, camera 1 moves and the presence or absence of a ball is inspected at a specified detection area (Step S20). Next, an evaluation of whether a ball is present in made by control circuit 8f (Step S21). In the case a ball is evaluated to be present, ball external circumference is detected (Step S22). Ball diameter is then calculated from this detection of circumference (Step S23). Next, ball inner circumference is detected (Step S24) to calculate ball location (Step S25). In detection of ball inner circumference, although the indentation of capillary 2 remains following bonding, in the case, for example, bonding is performed after the ball has been deformed, there is the possibility of the center of the ball outer circumference shifting from the center of its inner circumference. Consequently, the center of ball inner circumference (indentation left by capillary 2) is detected when calculating ball location.

(5) Feedback Processing of Camera Tool Distance (CTD)

Although, for example, distance S between the center of lens 1b of camera 1 and the center of capillary 2 is stored in memory in advance in the form of data in the X direction (data in the Y direction is also set similarly) as shown in FIG. 1 in the bonder as claimed in the present invention, in the case this distance is displaced due to mechanical error of the bonder, even though bonding is performed, there are cases in which there is a constant tendency for bonding to be performed which is shifted in the X and/or Y direction from the proper bonding location. Therefore, in such cases, the present bonder is equipped with an automatic correction function in which these amounts of deviation are accumulated, statistical processing is performed on that data, and corrections are made automatically by correcting and updating the camera tool distance (CTD) or individual bonding reference coordinates so that ball location equals pad center.

B. Inspection at a Second Bonding Point (1) Indentation Presence Inspection

Figure 16:
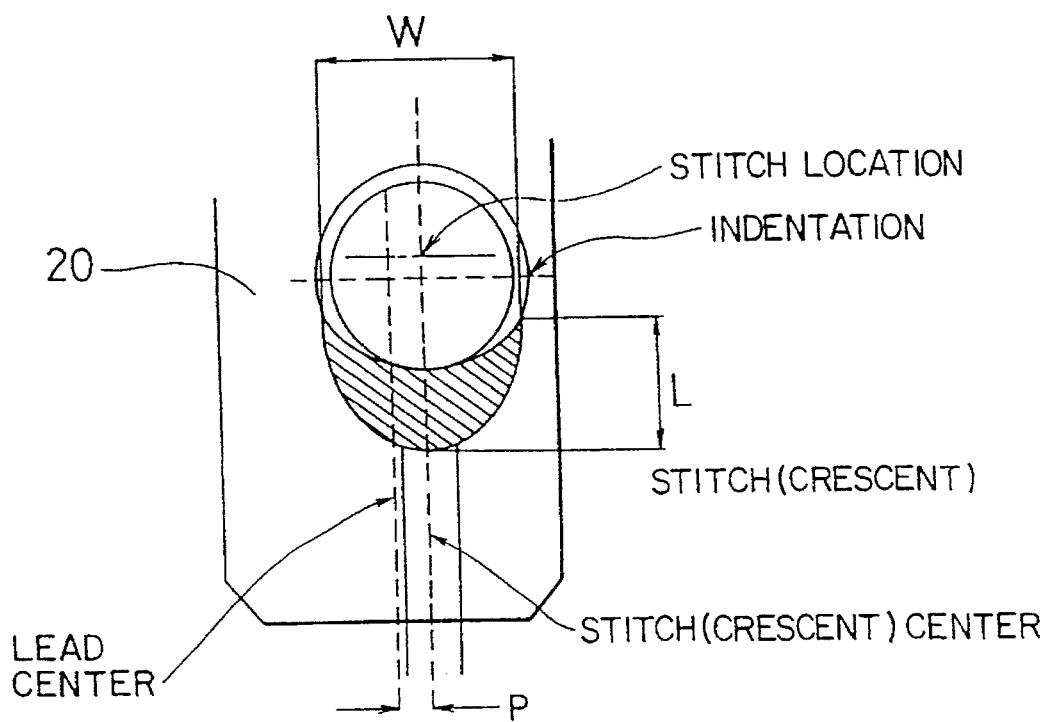
FIG. 16 is a drawing showing the state in which stitch bonding is performed using the wire bonder as claimed in the present invention.
Figure 17:
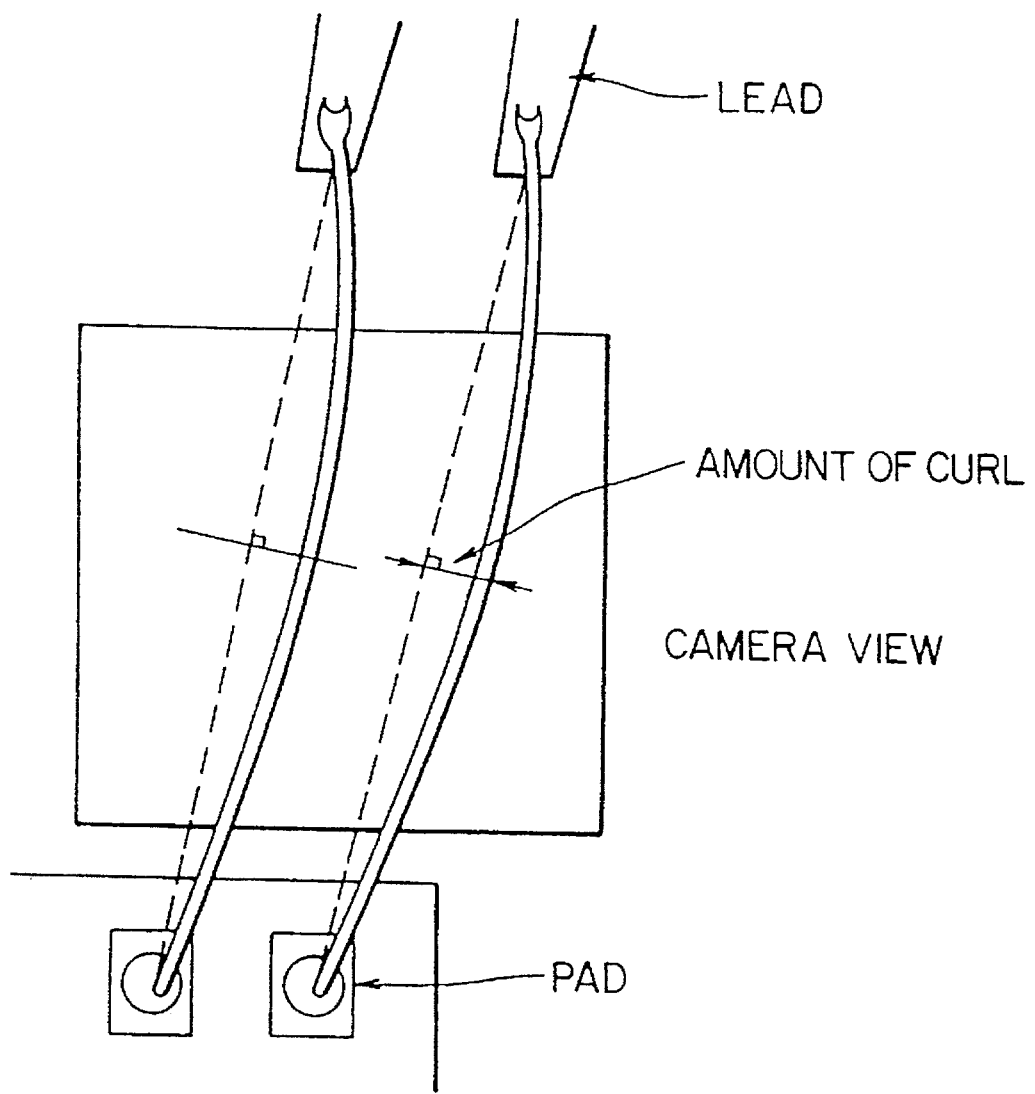
FIG. 17 is a drawing showing the state of a wire loop that has been bonded using the wire bonder as claimed in the present invention.

An evaluation is made as to whether there is an indentation of capillary 2 bonded on a second bonding point in the form of lead 20 as shown in FIG. 16. Namely, detection is made as to whether there is a capillary indentation bonded within a range specified from control apparatus 13 by movement of camera 1. In the case an indentation is not within a certain range, for example within a single screen, as a result of this detection, control apparatus 13 emits an alarm from an alarm apparatus not shown and/or notifies the operator using a notification device such as by displaying on monitor 10, followed by automatically stopping the apparatus. This is because this indicates the possibility of the wire not being securely connected to the lead or the capillary not reaching the location of the lead and so forth.

(2) Stitch Size Inspection

As shown in FIG. 16, the size of a stitch (crescent) bonded on a second bonding point in the form of lead 20 is detected. The size of the stitch within a certain range specified from control apparatus 13 is detected in the L and W directions, respectively, by movement of camera 1. This data is then returned to control apparatus 13 via control circuit 8f. In the case stitch size is not within a certain range, for example within a single screen, as a result of this detection, control apparatus 13 emits an alarm from an alarm apparatus not shown and/or notifies the operator using a notification device such as by displaying on monitor 10, followed by automatically stopping the apparatus. In the case stitch size is within a certain range according to the result of this detection, effective data is fed back to control apparatus 13 followed by accumulation and statistical processing. Bonding parameters such as ultrasonic wave parameters, load parameters and so forth are then corrected and updated to obtain the intended stitch size.

(3) Inspection of Stitch Location

The location of a stitch is detected that is bonded at a second bonding location. Namely, the size of an indentation is detected at least two-dimensionally in the horizontal directions by movement of camera 1 to determine the center of this indentation. This is taken to be the stitch location. This stitch location is, for example, detected in the form of the amount of deviation (P) in the X and Y directions two-dimensionally in the horizontal directions from the lead center, and this data is then returned to control apparatus 13 via control circuit 8f.

In the case the lead is of a complex shape and it cannot be specified in the width direction, or it is of an excessively large size and it cannot be detected in the width direction, the amount of deviation is calculated from a location specified in advance from control apparatus 13. In the case the result of this detection is not within a certain range of deviation, for example, not within a single screen, control apparatus 13 emits an alarm from an alarm apparatus not shown and/or notifies the operator using a notification device such as by displaying on monitor 10, followed by automatically stopping the apparatus.

In addition, effective data is accumulated and statistical processing is performed followed by correction and updating of the camera tool distance (CTD) or individual bonding reference coordinates so that stitch location equals the lead center. Furthermore, although stopping of the apparatus and so forth is stored in memory in the case an indentation is evaluated as being absent in the indentation presence inspection described in (1) above, processing is performed in the form of programming so that the stitch size inspection of (2) and stitch location inspection of (3) can be suitably combined even in the case the indentation is absent.

(4) Wire Presence Inspection

In addition, an evaluation is made as to whether a wire that has been bonded to a second bonding location is present or absent. The presence or absence of a wire is detected that has been bonded within a range specified from control apparatus 13 by movement of camera 1. This detection is performed because there are cases in which the wire is not connected even though both an indentation and stitch are present. In the case a wire is not within a certain range, for example within a single screen, according to the result of this detection, control apparatus 13 emits an alarm from an alarm apparatus not shown and/or notifies the operator using a notification device such as by displaying on monitor 10, followed by automatically stopping the apparatus. This inspection is able to detect bonding misattachments, including broken wires and misattachment, without making contact. According to this method, although ordinary methods for inspecting whether bonding has been performed properly using extremely low current are not preferable since there are cases in which this type of inspection induces damage to the semiconductor and so forth, this method is able to perform evaluations without making contact.

(5) Loop Inspection

In the present invention, the amount of curl of a bonded loop can be measured near the midpoint of a wire. A loop specified from control apparatus 13, for example, a loop within a certain area from the midpoint of a wire connecting a first bonding point and second bonding point, is detected by movement of camera 1 followed by output of distance data from the midpoint of the loop. When the amount of curvature is not within a certain range, for example, within a single screen, according to the result of this detection, control apparatus 13 emits an alarm from an alarm apparatus not shown and/or notifies the operator using a notification device such as by displaying on monitor 10, followed by automatically stopping the apparatus. Since there are cases in which the wire may make contact with an adjacent wire and so forth, effective data is accumulated and statistical processing is performed followed by updating of individual bonding parameters and so forth so that the amount of curvature equals zero.

C. Measurement of Initial Ball

The present invention is able to measure the diameter of an initial ball manually formed on an island and so forth using a recognition device. Namely, the diameter of an initial ball at a location specified from control apparatus 13 is detected by movement of camera 1 followed by output of that data. In addition, in the case ball diameter is within a predetermined size range, this effective data is fed back to control apparatus 13 followed by accumulation and statistical processing. The output data for an electrical discharge device in the form of an electric torch is corrected so that the set value of an operating device in the form of keyboard 19 equals ball size.

Figure 20:
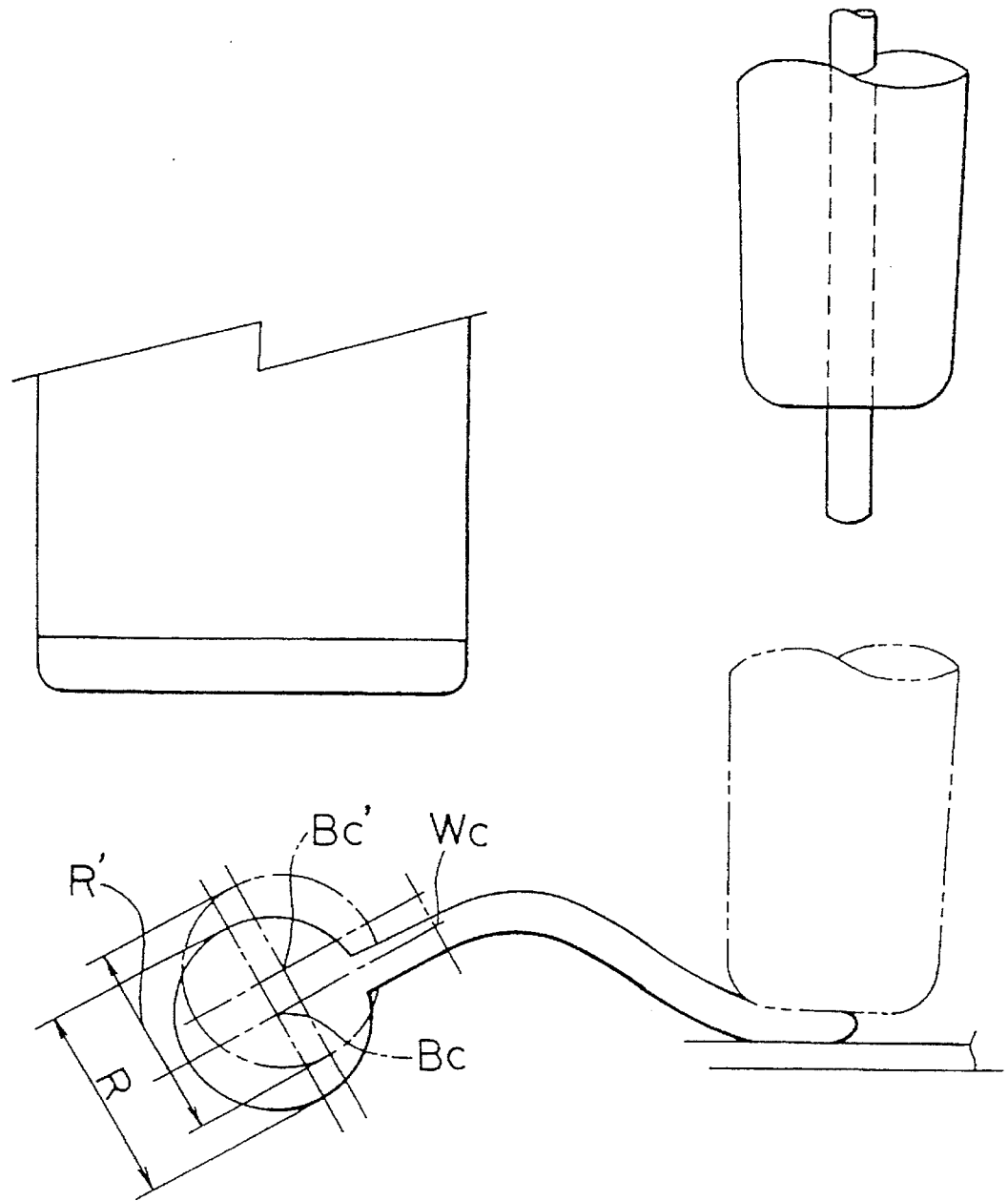
FIG. 20 is an enlarged view showing the state in which the initial ball shown in FIG. 19 is measured.

In addition, the present invention measures the diameter of an initial ball at a location specified from control apparatus 13 and the diameter of a wire on which this ball is formed by movement of camera 1, followed by determination of the respective centers of ball diameter and wire diameter. In the case the ball center is at the location of $B_c'$, namely the location at which the center of wire diameter $W_c$ and the inherent ball center $B_c$ are not aligned but rather shifted from each other as shown in FIG. 20 based on the results of this measurement, this means that the ball is deformed with respect to the wire. Thus, the quality by which the ball is formed can be evaluated by calculating the amount of this deviation between the center of wire diameter and the ball center.

The following provides an explanation of measurement of this initial ball using FIG. 19.

To begin with, air is blown from air tension device 51 in the direction indicated with an arrow as shown in FIG. 19(a). Since clamp 48a is also open at this time, a ball formed on the end of a wire is held on the end of a capillary. Next, air tension device 51 is switched to suction air and wire 49 is fed in the downward direction indicated with an arrow as shown in FIG. 19(b). Then, as shown in FIG. 19(c), clamp 48a closes (shown in FIG. 19(d)) after wire 49 has been sufficiently fed downward to the end of capillary 2. In the process through FIG. 19(e), simultaneous to lowering of bonding arm 41 shown in FIG. 8, XY table 4 is driven and controlled so as to reach the state shown in FIG. 19(e). Ultrasonic waves are then applied in the direction of the arrows in FIG. 19(e) to the end of capillary 2 while still in this state resulting in connection of the wire and a lead (or island). Next, as shown in FIG. 19(f), clamp 48a closes at the point capillary 2 rises resulting in severing of wire 49. Next, as shown in FIG. 19(g), XY table 4 is driven and camera 1 is positioned above ball B. FIG. 20 shows an enlarged view of this state. As a result of employing such a method, ball B is photographed using the recognition device as claimed in the present invention thereby allowing measurement of the diameter of the initial ball. Furthermore, it goes without saying that the timing by which clamp 48a is opened and closed can be suitably varied. In addition, although air tension device 51 is used in the present embodiment for the device which feeds out the wire, this can naturally be suitably changed using another apparatus and so forth.

Furthermore, although effective data is accumulated and statistically processed in the present embodiment, the above-mentioned effective data may also be fed back directly. In addition, although the present invention has an automatic inspection function as described above, this may naturally be suitably changed and used provided it is within the scope of the purport of the present invention.

As is clear from the explanation provided above, the present invention offers the advantage of being able to effectively utilize positional information such as coordinates and so forth that have been stored in advance in the memory of a wire bonder. Thus, there is no need to enter new data and so forth. In addition, since the present invention is able to automatically perform bonding inspections on an apparatus without using a separate inspection apparatus, it offers the additional advantage of being able to effectively use data by immediately feeding back said data to the apparatus even in the case problems, such as connection defects, occur as a result of said inspection. Finally, since adjustment locations of the apparatus can be easily determined by anyone, the present invention also offers the advantage of being able to improve the stability and reliability of the apparatus, while also being able to reduce space and cost.

What is claimed is:

1. A wire bonder for bonding a wire to an electronic means, comprising:

a table for supporting said electronic means;

a recognition device including a camera and memory;

a control device for performing various controls based on the evaluation from said recognition device; and a drive device that drives at least one of said camera and said table relative to each other based on commands from said control device, wherein a first or second bonding point in the form of bonded sites on said electronic means is photographed by said camera based on commands from said control device, and inspection is performed by said control device as to whether a bonded indentation is present within a specified range at a location specified in advance on said electronic means.

2. A wire bonder of claim 1, wherein at least one of (1) notification is performed by said control device and (2) said apparatus is stopped in the case a bonded indentation is evaluated as not being present within said specified range.

3. The wire bonder as set forth in claim 2 wherein said indentation is the indentation of a bonding tool.

4. The wire bonder as set forth in claim 1 wherein said indentation is the indentation of a bonding tool.

5. A wire bonding method comprising the following steps:

photographing a first or second bonding point in the form of bonded sites; and determining whether a bonded indentation is present within a specified range at a location specified in advance and/or centered on said location.

6. A wire bonding method according to claim 5, further comprising the steps of notifying an operator and stopping the bonding method when a bonded indentation is evaluated as not being present within said specified range.

7. The wire bonding method as set forth in claim 6 wherein said indentation is the indentation of a bonding tool.

8. The wire bonding method as set forth in claim 5 wherein said indentation is the indentation of a bonding tool.

9. A wire bonder according to claim 1 wherein inspection of one of indentation and stitch size is performed by said control device.

10. The wire bonder as set forth in claim 9 wherein said stitch is the stitch of a wire.

11. The wire bonder as set forth in claim 9 wherein said inspection of stitch size is performed so as to detect the size of the stitch at least two-dimensionally in the horizontal directions by a photographic device.

12. The wire bonder as set forth in claim 9 wherein said inspection of stitch size is performed so as to evaluate whether said stitch size is within a predetermined stitch size range.

13. The wire bonder as set forth in claim 9 wherein said inspection of stitch size is performed so that notification is performed by said control device and the apparatus is stopped when said stitch size is evaluated as being outside a predetermined stitch size range, and accumulation of said stitch data and statistical processing are performed by said control device when within said stitch size range.

14. The wire bonder as set forth in claim 9 wherein said inspection of stitch size is performed so that one of (1) notification is performed by a notification device and (2) the apparatus is stopped when said stitch size is evaluated as being outside a predetermined stitch size range, said stitch size data is fed back to said control device, said stitch size data is accumulated and statistical processing is performed by said control device when within said stitch size range, and bonding parameters such as ultrasonic wave and load parameters are corrected and updated.

15. A wire bonding method according to claim 5, further comprising the step of performing an inspection of one of indentation and stitch size.

16. The wire bonding method as set forth in claim 15 wherein said stitch is the stitch of a wire.

17. The wire bonding method as set forth in claim 15 wherein said inspection of stitch size is performed so as to detect the size of the stitch at least two-dimensionally in the horizontal directions by a photographic device.

18. The wire bonding method as set forth in claim 15 wherein said inspection of stitch size is performed so as to evaluate whether said stitch size is within a predetermined stitch size range.

19. The wire bonding method as set forth in claim 15 wherein said inspection of stitch size is performed so that one of (1) notification is performed and (2) the wire bonding method is stopped when said stitch size is evaluated as being outside a predetermined stitch size range, and accumulation of said stitch size data and statistical processing are performed when within said stitch size range.

20. The wire bonding method as set forth in claim 15, further comprising the following steps:

notifying an operator and stopping the wire bonding method wherein said inspection of stitch size is performed so that one of (1) notification is performed and (2) the bonding method is stopped when said stitch size is evaluated as being outside a predetermined stitch size range as a result of said inspection step;

feeding said stitch data to a control device; and correcting and updating bonding parameters such as ultrasonic wave and load parameters by said control device when said stitch data is within said stitch size range.

21. A wire bonder for bonding a wire to an electronic means, comprising:

a table for supporting said electronic means;

a recognition device including a camera and memory;

a control device that performs various controls based on the evaluation from said recognition device; and a drive device that drives at least one of said camera and said table relative to each other based on commands from said control device, wherein a first or second bonding point in the form of bonded sites on said electronic means is photographed by said camera based on commands from said control device, inspection is performed as to whether a bonded indentation is present within a specified range at a location specified in advance on said electronic means, and stitch location is detected from a specified location by said control device when an indentation is evaluated as being present.

22. The wire bonder as set forth in claim 21 wherein said specified location is the center of a lead.

23. The wire bonder as set forth in claim 21 wherein said detection of an indentation is performed so as to determine the location of a stitch by detecting the size of the indentation at least two-dimensionally in the horizontal directions by a photographic device, and calculate the amount of deviation between the said stitch location and the center of a lead in the form of said first or second bonding point.

24. The wire bonder as set forth in claim 21 wherein said detection of stitch location is performed so that at least one of (1) notification is performed by said control device and (2) the apparatus is stopped when said deviation is evaluated as being outside a predetermined deviation range, and accumulation of said data and statistical processing are performed by said control device when within said predetermined deviation range.

25. A wire bonding method comprising the following steps:

photographing a first or second bonding point in the form of bonded sites;

determining whether a bonded indentation is present within a specified range at a location specified in advance; and detecting stitch location from a specified location when an indentation is evaluated as being present.

26. The wire bonding method as set forth in claim 25 wherein said specified location is the center of a lead.

27. The wire bonding method as set forth in claim 25 wherein said detection of an indentation is performed so as to determine the location of a stitch by detecting the size of the indentation at least two-dimensionally in the horizontal directions by a photographic device, and calculate the amount of deviation between said stitch location and the center of a lead in the form of said first or second bonding point.

28. The wire bonding method as set forth in claim 25 wherein said detection of stitch location is performed so that notification is performed by a notification device and the apparatus is stopped when said deviation is evaluated as being outside a predetermined deviation range, and accumulation of said data and statistical processing are performed when within said predetermined deviation range.

29. A wire bonder for bonding a wire to an electronic means, comprising:

a table for supporting said electronic means;

a recognition device including a camera and memory;

a control device that performs various controls based on the evaluation from said recognition device; and a drive device that drives said camera and said table relative to each other based on commands from said control device, wherein a first or second bonding point in the form of bonded sites on said electronic means is photographed by said camera based on commands from said control device, inspection is performed as to whether a bonded indentation is present within a specified range at a location specified in advance, the amount of deviation to the location of an indentation from a specified location is detected by said control device when an indentation is evaluated as being present, said data is accumulated and statistical processing is performed when said amount of deviation is within a predetermined deviation range, and one of camera tool distance and individual bonding reference coordinates are corrected and updated so that said indentation location agrees with a location specified in advance on said electronic means.

30. The wire bonder as set forth in claim 29 wherein said specified location is the center of a lead.

31. A wire bonding method comprising the following steps:

photographing a first or second bonding point in the form of bonded sites;

determining whether a bonded indentation is present within a specified range at a location specified in advance on said location;

detecting the amount of deviation to the location of an indentation from a specified location when an indentation is evaluated as being present;

accumulating and processing said data when said amount of deviation is within a predetermined deviation range; and correcting one of camera tool distance and individual bonding reference coordinates so that said indentation location agrees with a location specified in advance.

32. The wire bonding method as set forth in claim 31 wherein said specified location is the center of a lead.

33. A wire bonder for bonding a wire to an electronic means, comprising:

a table for supporting said electronic means;

a recognition device including a camera;

a control device that performs various controls based on the evaluation from said recognition device; and a drive device that drives at least one of said camera and said table relative to each other based on commands from said control device, wherein a first or second bonding point in the form of bonded sites on said electronic means is photographed by said camera based on commands from said control device, inspection is performed as to whether a bonded wire is present within a specified range at a location specified in advance on said electronic means, and detection of misattachment of said bonded wire is performed.

34. A wire bonder for bonding a wire to an electronic means, comprising:

a table for supporting said electronic means;

a recognition device including a camera and memory;

a control device that performs various controls based on the evaluation from said recognition device; and a drive device that drives at least one of said camera and said table relative to each other based on commands from said control device, wherein a first or second bonding point in the form of bonded sites on said electronic means is photographed by said camera based on commands from said control device, inspection is performed as to whether a bonded wire is present within a specified range at a location specified in advance on said electronic means, detection of misattachment of said bonded wire is performed, and notification is performed by said control device and said apparatus is stopped in case a bonded wire is evaluated as not being present at a predetermined location.

35. A wire bonding method comprising the following steps:

photographing a first or second bonding point in the form of bonded sites;

determining whether a bonded wire is present within a specified range at a location specified in advance on said location; and detecting whether misattachment of said bonded wire has occurred.

36. A wire bonding method according to claim 35, further comprising the step of one of (1) notifying an operator and (2) stopping the bonding method in the case a bonded wire is evaluated as not being present at a predetermined location.

37. A wire bonding method comprising the following steps:

photographing a first or second bonding point in the form of bonded sites;

determining whether a bonded wire is present within a specified range of a location specified in advance; and determining the amount of wire curvature by determining the distance from a location specified in advance between said first bonding point and said second bonding point to the wire when the wire is evaluated as being present according to said inspection.

38. A wire bonding method according to claim 37, further comprising the following steps:

notifying an operator and stopping said method when said amount of curvature is outside a predetermined range;

accumulating and processing said data when said amount of curvature is within a predetermined range; and correcting and updating individual bonding parameters so that said amount of curvature is within a predetermined range.

39. The wire bonding method as set forth in claim 37 wherein said location specified in advance is the midpoint of a loop.

* * * * *